United States Patent
Huang

(10) Patent No.: US 12,446,211 B2
(45) Date of Patent: Oct. 14, 2025

(54) MEMORY DEVICE HAVING ULTRA-LIGHTLY DOPED REGION

(71) Applicant: NANYA TECHNOLOGY CORPORATION, New Taipei (TW)

(72) Inventor: Chung-Lin Huang, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 455 days.

(21) Appl. No.: 18/078,349

(22) Filed: Dec. 9, 2022

(65) Prior Publication Data
US 2024/0196595 A1    Jun. 13, 2024

(51) Int. Cl.
H10B 12/00    (2023.01)

(52) U.S. Cl.
CPC ........... *H10B 12/34* (2023.02); *H10B 12/053* (2023.02)

(58) Field of Classification Search
CPC ..... H10B 12/053; H10B 12/34; H10B 12/488
USPC ....................................................... 257/330
See application file for complete search history.

(56) References Cited

U.S. PATENT DOCUMENTS

| | | | |
|---|---|---|---|
| 6,252,277 B1* | 6/2001 | Chan | H10D 30/0275 |
| | | | 257/E29.267 |
| 2012/0145985 A1 | 6/2012 | Lee | |
| 2015/0333068 A1 | 11/2015 | Toh et al. | |
| 2022/0102355 A1 | 3/2022 | Su | |

FOREIGN PATENT DOCUMENTS

| | | | |
|---|---|---|---|
| TW | 201042765 A | 12/2010 | |
| TW | 201715702 A | 5/2017 | |
| TW | 202131514 A | 8/2021 | |

OTHER PUBLICATIONS

Office Action and and the search report mailed on Mar. 12, 2024 related to Taiwanese Application No. 112122197.
Office Action and and the search report mailed on May 10, 2024 related to Taiwanese Application No. 113100930.

\* cited by examiner

*Primary Examiner* — Hoai V Pham
(74) *Attorney, Agent, or Firm* — Xuan Zhang

(57) ABSTRACT

The present application provides a memory device having an ultra-lightly doped region and a manufacturing method of the memory device. The memory device includes a semiconductor substrate including a word line extending into the semiconductor substrate, wherein the semiconductor substrate is defined with a source region, a drain region and an ultra-lightly doped region under the drain region, the word line is disposed between the source region and the drain region, and the ultra-lightly doped region is disposed at a sidewall of the word line.

7 Claims, 33 Drawing Sheets

MEMORY DEVICE HAVING ULTRA-LIGHTLY DOPED REGION

TECHNICAL FIELD

The present disclosure relates to a memory device, and more particularly, to a memory device having an ultra-lightly doped region around a word line (WL).

DISCUSSION OF THE BACKGROUND

Dynamic random-access memory (DRAM) is a type of semiconductor arrangement for storing bits of data in separate capacitors within an integrated circuit (IC). DRAMs are commonly formed as trench capacitor DRAM cells. An advanced method of fabricating a buried gate electrode involves building a gate electrode of a transistor and a word line in a trench in an active area (AA) comprising a shallow trench isolation (STI) structure.

Over the past few decades, as semiconductor fabrication technology has continuously improved, sizes of electronic devices have been correspondingly reduced. As a size of a cell transistor is reduced to a few nanometers in length, current leakage may occur. The leakage may result in a significant drop in performance of the cell transistors. It is therefore desirable to develop improvements that address related manufacturing challenges.

SUMMARY

One aspect of the present disclosure provides a memory device. The memory device includes a semiconductor substrate including a word line extending into the semiconductor substrate, wherein the semiconductor substrate is defined with a source region, a drain region and an ultra-lightly doped region under the drain region, the word line is disposed between the source region and the drain region, and the ultra-lightly doped region is disposed at a sidewall of the word line.

In some embodiments, the source region and the drain region at least partially surround an upper portion of the word line, and the ultra-lightly doped region at least partially surrounds a lower portion of the word line.

In some embodiments, a doping concentration of the drain region is substantially greater than a doping concentration of the ultra-lightly doped region, and a doping concentration of the source region is substantially greater than the doping concentration of the ultra-lightly doped region.

In some embodiments, the semiconductor substrate is further defined with a heavily doped region under the drain region and a lightly doped region above the ultra-lightly doped region.

In some embodiments, the heavily doped region and the lightly doped region are disposed between the drain region and the ultra-lightly doped region, and the heavily doped region is disposed between the drain region and the lightly doped region.

In some embodiments, a doping concentration of the heavily doped region is substantially less than a doping concentration of the drain region and is substantially greater than a doping concentration of the ultra-lightly doped region.

In some embodiments, a doping concentration of the lightly doped region is substantially less than a doping concentration of the heavily doped region and is substantially greater than a doping concentration of the ultra-lightly doped region.

In some embodiments, the ultra-lightly doped region is below a surface of the semiconductor substrate by a distance of about 20 nm to about 80 nm.

In some embodiments, the memory device further comprises a plug extending into the semiconductor substrate and disposed adjacent to the word line.

In some embodiments, the plug includes silicon, titanium nitride (TiN), silicon nitride (SiN), silicon oxide (SiO) or tungsten (W).

In some embodiments, a length of the plug is substantially less than a length of the word line.

In some embodiments, the length of the plug is about 20 nm to about 70 nm.

In some embodiments, the length of the word line is about 120 nm to about 200 nm.

Another aspect of the present disclosure provides a memory device. The memory device includes a semiconductor substrate including a word line extending into the semiconductor substrate and a plug extending into the semiconductor substrate and disposed adjacent to the word line, wherein the semiconductor substrate is defined with a source region, a drain region opposite to the source region, and an ultra-lightly doped region under the drain region, the word line is disposed between the source region and the drain region, and the ultra-lightly doped region is disposed at a sidewall of the word line.

In some embodiments, the ultra-lightly doped region includes a first ultra-lightly doped region having a first conductivity type and a second ultra-lightly doped region having a second conductivity type different from the first conductivity type.

In some embodiments, the first ultra-lightly doped region is disposed above the second ultra-lightly doped region.

In some embodiments, the first conductivity type is N-type, and the second conductivity type is P-type.

In some embodiments, a length of the word line is substantially greater than or equal to a depth of the ultra-lightly doped region.

In some embodiments, the word line includes a gate oxide extending into the semiconductor substrate, a gate electrode disposed on the gate oxide, a buffering dielectric conformal to the gate oxide and on the gate electrode, and a capping dielectric surrounded by the buffering dielectric.

In some embodiments, the ultra-lightly doped region is adjacent to a bottom portion of the buffering dielectric, wherein the bottom portion of the buffering dielectric contacts the gate electrode and the capping dielectric.

Another aspect of the present disclosure provides a method of manufacturing a memory device. The method includes steps of providing a semiconductor substrate; forming a word line extending into the semiconductor substrate; forming a recess adjacent to the word line; and implanting dopants into the semiconductor substrate through the second recess, wherein the dopants collide with the semiconductor substrate exposed through the recess and diffuse across the word line to form an ultra-lightly doped region over a sidewall of the word line.

In some embodiments, the implantation of the dopants is performed after the formation of the word line.

In some embodiments, a depth of the recess is substantially less than a depth of the word line.

In some embodiments, the depth of the word line is about 120 nm to about 200 nm.

In some embodiments, the depth of the recess is about 10 nm to about 50 nm.

In some embodiments, the method further comprises forming a trench extending into the semiconductor substrate prior to the implantation of the dopants.

In some embodiments, the method further comprises disposing a hard mask layer over the semiconductor substrate prior to the formation of the word line, wherein the first recess and the second recess extend through the hard mask layer.

In some embodiments, the hard mask layer is removed after the implantation of the dopants.

In some embodiments, the hard mask layer includes nitride.

In some embodiments, a thickness of the hard mask layer is about 30 nm to about 50 nm.

In some embodiments, the hard mask layer blocks the dopants from being implanted into the semiconductor substrate.

In some embodiments, the dopants are partially blocked by the word line.

In some embodiments, the dopants have a kinetic energy in a range of about 1 KeV to about 30 KeV.

In some embodiments, the dopants include boron, phosphorous or arsenic.

In some embodiments, the method further includes forming a plug within the recess after the implantation of the dopants.

In some embodiments, a semiconductive material is deposited into the recess after the implantation of the dopants.

In conclusion, because an ultra-lightly doped region can be formed adjacent to a word line and under a drain region connected to a capacitor, a gate-induced drain leakage (GIDL) can be suppressed. Further, the ultra-lightly doped region is formed by removing a portion of a substrate to form a recess adjacent to the word line, and then implanting dopants through the recess. The dopants are partially blocked by the word line. As a result, the ultra-lightly doped region can be formed at a sidewall of the word line. Therefore, thermal budget for manufacturing a memory device having the ultra-lightly doped region can be reduced. As a result, reliability and performance of the memory device are improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

DETAILED DESCRIPTION

Figure 1:
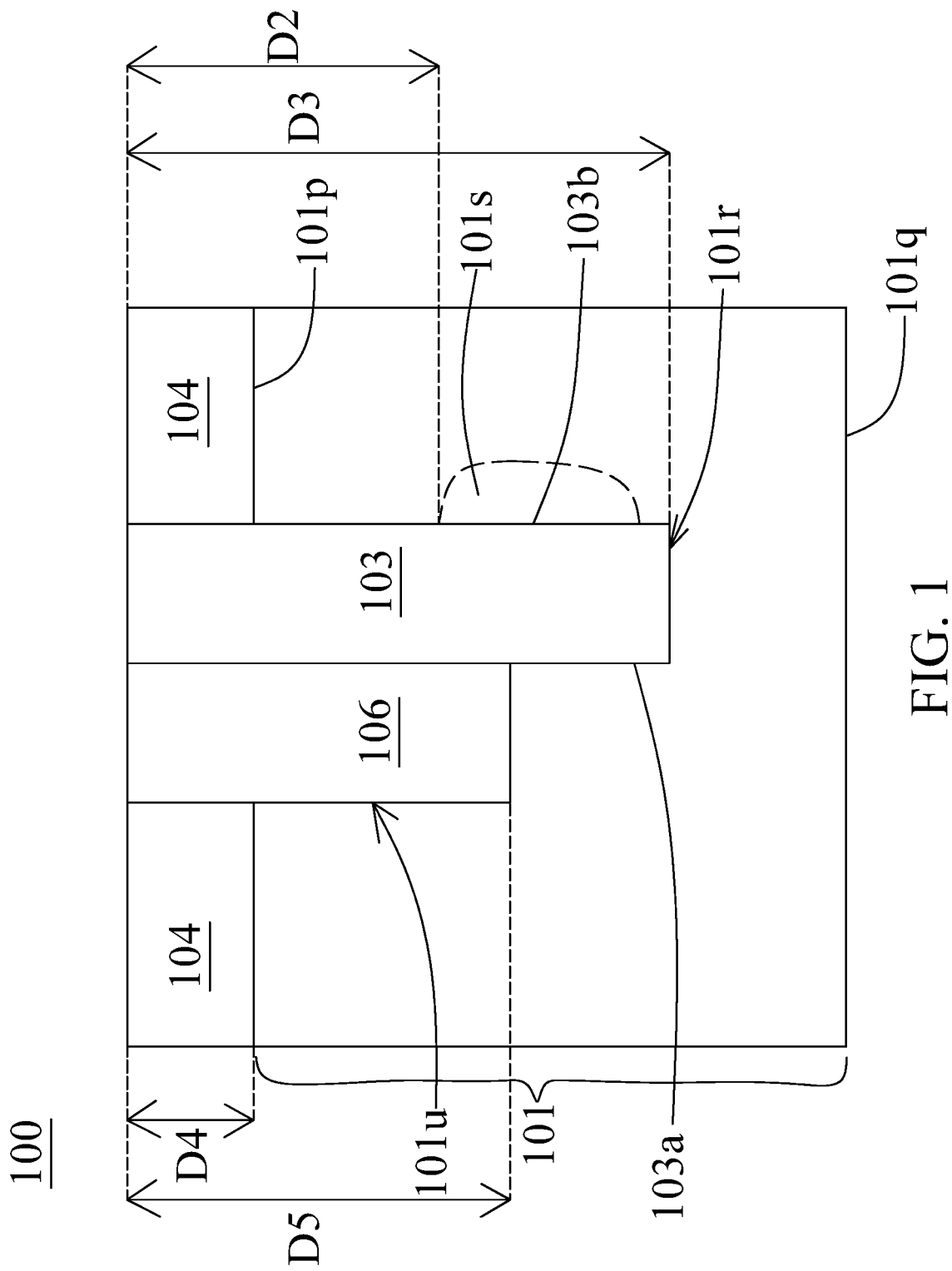
FIG. 1 is a cross-sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view of a semiconductor structure 100 in accordance with some embodiments of the present disclosure. In some embodiments, the semiconductor structure 100 includes a semiconductor substrate 101. In some embodiments, the semiconductor substrate 101 includes semiconductive material such as silicon, germanium, gallium, arsenic, or a combination thereof. In some embodiments, the semiconductor substrate 101 includes bulk semiconductor material. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate.

In some embodiments, the semiconductor substrate 101 includes a first surface 101p and a second surface 101q opposite to the first surface 101p. In some embodiments, the first surface 101p is a front side of the semiconductor substrate 101, wherein electrical devices or components are subsequently formed over the first surface 101p and configured to electrically connect to an external circuitry. In some embodiments, the second surface 101q is a back side of the semiconductor substrate 101, where electrical devices or components are absent.

In some embodiments, the semiconductor structure 100 includes a hard mask layer 104 disposed over the semiconductor substrate 101. In some embodiments, the hard mask layer 104 is disposed over the first surface 101p of the semiconductor substrate 101.

In some embodiments, the hard mask layer 104 includes dielectric material such as nitride. In some embodiments, a thickness D4 of the hard mask layer 104 is about 30 nm to about 50 nm.

In some embodiments, the semiconductor structure 100 includes a blocking member 103 extending into the semiconductor substrate 101. In some embodiments, the blocking member 103 extends through the hard mask layer 104. In some embodiments, the blocking member 103 is configured to partially block dopants from passing through.

In some embodiments, the blocking member 103 is disposed within a first recess 101r, wherein the first recess 101r extends through the hard mask layer 104 and partially through the semiconductor substrate 101. In some embodiments, the blocking member 103 includes titanium nitride (TiN), silicon nitride (SiN), silicon oxide (SiO) or tungsten (W). In some embodiments, a depth D3 of the blocking member 103 is about 20 nm to about 70 nm. In some embodiments, the blocking member 103 includes a third side 103a and a fourth side 103b opposite to the third side 103a.

In some embodiments, the semiconductor structure 100 includes a plug 106 extending into the semiconductor substrate 101. In some embodiments, the plug 106 extends through the hard mask layer 104. In some embodiments, the plug 106 is disposed within a second recess 101u, wherein the second recess 101u extends through the hard mask layer 104 and partially through the semiconductor substrate 101.

In some embodiments, the plug 106 includes semiconductive, conductive or insulating material such as silicon, titanium nitride (TiN), silicon nitride (SiN), silicon oxide (SiO) or tungsten (W). In some embodiments, the plug 106 is an electrical contact or a part of an electrical contact. In some embodiments, a depth D5 of the second recess 101u is about 10 nm to about 50 nm. In some embodiments, the depth D5 of the second recess 101u is substantially less than the depth D3 of the first recess 101r.

In some embodiments, the semiconductor structure 100 includes an ultra-lightly doped region 101s over the fourth side 103b of the blocking member 103. In some embodiments, the ultra-lightly doped region 101s at least partially surrounds a lower portion of the blocking member 103. In some embodiments, a depth D2 of the ultra-lightly doped region 101s is substantially less than the depth D3 of the blocking member 103.

In some embodiments, dopants are included in the ultra-lightly doped region 101s. In some embodiments, the dopants are N-type dopants or P-type dopants. In some embodiments, the dopants include boron or phosphorous. In some embodiments, a doping concentration of the dopants at the third side 103a of the blocking member 103 is substantially greater than a doping concertation of the dopants at the fourth side 103b of the blocking member 103. In some embodiments, the doping concentration of the ultra-lightly doped region 101s is about $10^{16}$ per $cm^3$ to about $10^{18}$ per $cm^3$.

Figure 2:
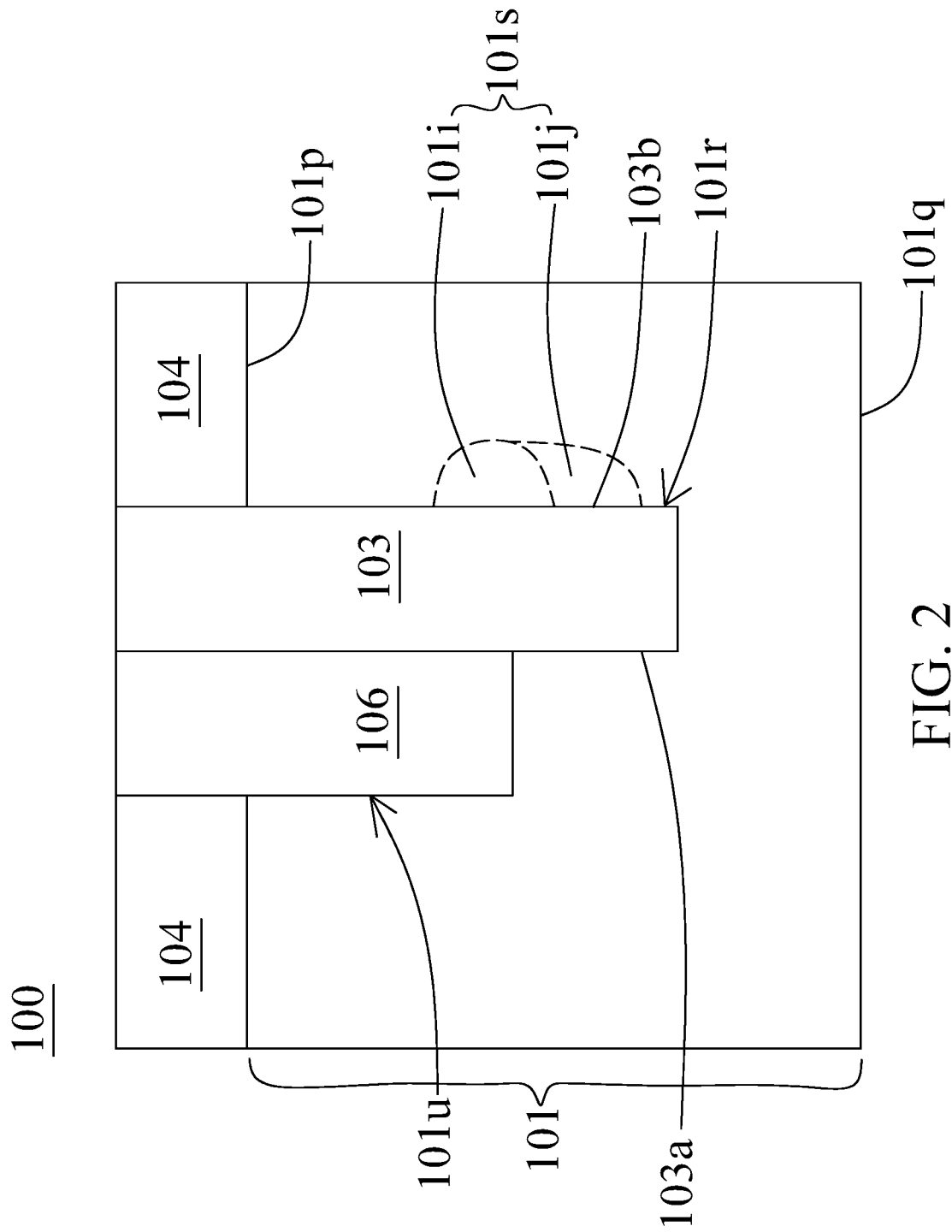
FIG. 2 is a cross-sectional view of another embodiment of a semiconductor structure.

FIG. 2 illustrates another embodiment of the semiconductor structure 100. The embodiment shown in FIG. 2 is similar to the embodiment shown in FIG. 1, except the ultra-lightly doped region 101s includes a first ultra-lightly doped region 101i and a second ultra-lightly doped region 101j in the embodiment shown in FIG. 2. In some embodiments, the first ultra-lightly doped region 101i has a first conductivity type and the second ultra-lightly doped region 101j has a second conductivity type different from the first conductivity type.

In some embodiments, the first ultra-lightly doped region 101i includes N-type dopants, and the second ultra-lightly doped region 101j includes P-type dopants. In some embodiments, the first ultra-lightly doped region 101i has a doping concentration substantially same as that of the second ultra-lightly doped region 101j.

Figure 3:
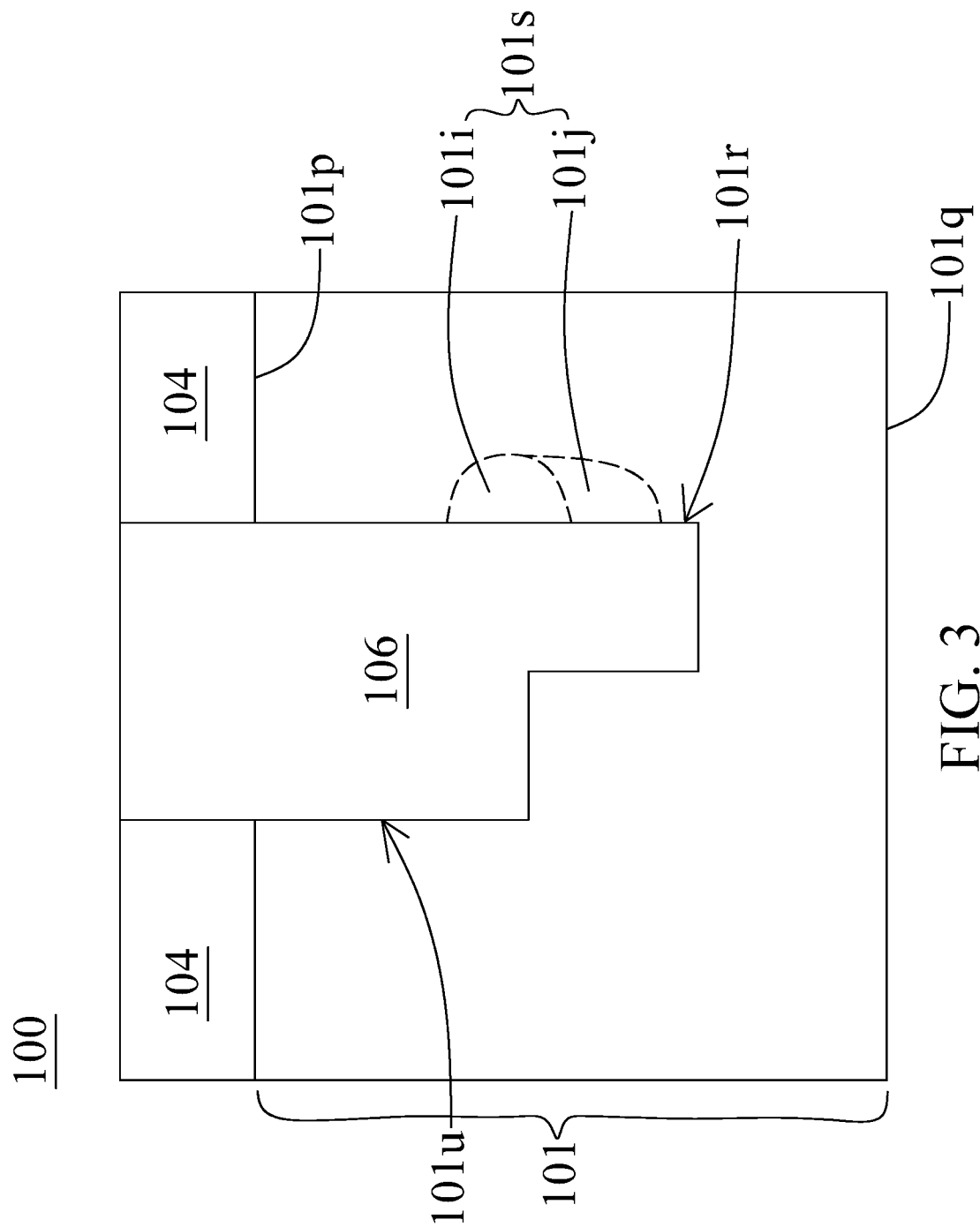
FIG. 3 is a cross-sectional view of another embodiment of a semiconductor structure

FIG. 3 illustrates another embodiment of the semiconductor structure 100. The embodiment shown in FIG. 3 is similar to the embodiment shown in FIG. 2, except the blocking member 103 is absent and the plug 106 fills the first recess 101r and the second recess 101u in the embodiment shown in FIG. 3. In some embodiments, the plug 106 is in an L shape.

Figure 4:
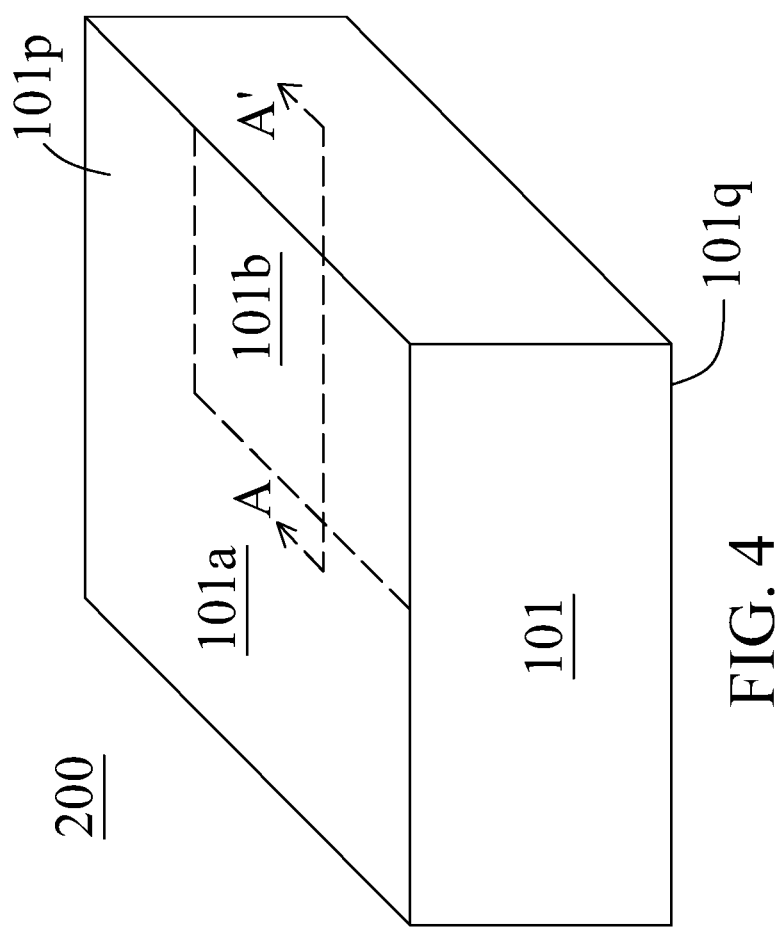
FIG. 4 is a perspective side view of a memory device in accordance with some embodiments of the present disclosure.

FIG. 4 is a schematic perspective view of a memory device 200 in accordance with some embodiments of the present disclosure. In some embodiments, the memory device 200 includes several unit cells arranged along rows and columns. In some embodiments, the memory device 200 includes a semiconductor substrate 101.

In some embodiments, the semiconductor substrate 101 includes semiconductive material such as silicon, germanium, gallium, arsenic, or a combination thereof. In some embodiments, the semiconductor substrate 101 includes bulk semiconductor material. In some embodiments, the semiconductor substrate 101 is a semiconductor wafer (e.g., a silicon wafer) a or semiconductor-on-insulator (SOI) wafer (e.g., a silicon-on-insulator wafer). In some embodiments, the semiconductor substrate 101 is a silicon substrate.

In some embodiments, the memory device 200 is defined with a peripheral region 101a and an array area 101b at least partially surrounded by the peripheral region 101a. In some embodiments, the peripheral region 101a is adjacent to a periphery of the semiconductor substrate 101, and the array area 101b is adjacent to a central area of the semiconductor substrate 101. In some embodiments, the array area 101b is used for fabricating transistors such as a metal-oxide-semiconductor field effect transistor (MOSFET).

In some embodiments, the semiconductor substrate 101 includes a first surface 101p and a second surface 101q opposite to the first surface 101p. In some embodiments, the first surface 101p is a front side of the semiconductor substrate 101, wherein electrical devices or components are subsequently formed over the first surface 101p and configured to electrically connect to an external circuitry. In some embodiments, the second surface 101q is a back side of the semiconductor substrate 101, where electrical devices or components are absent.

Figure 5:
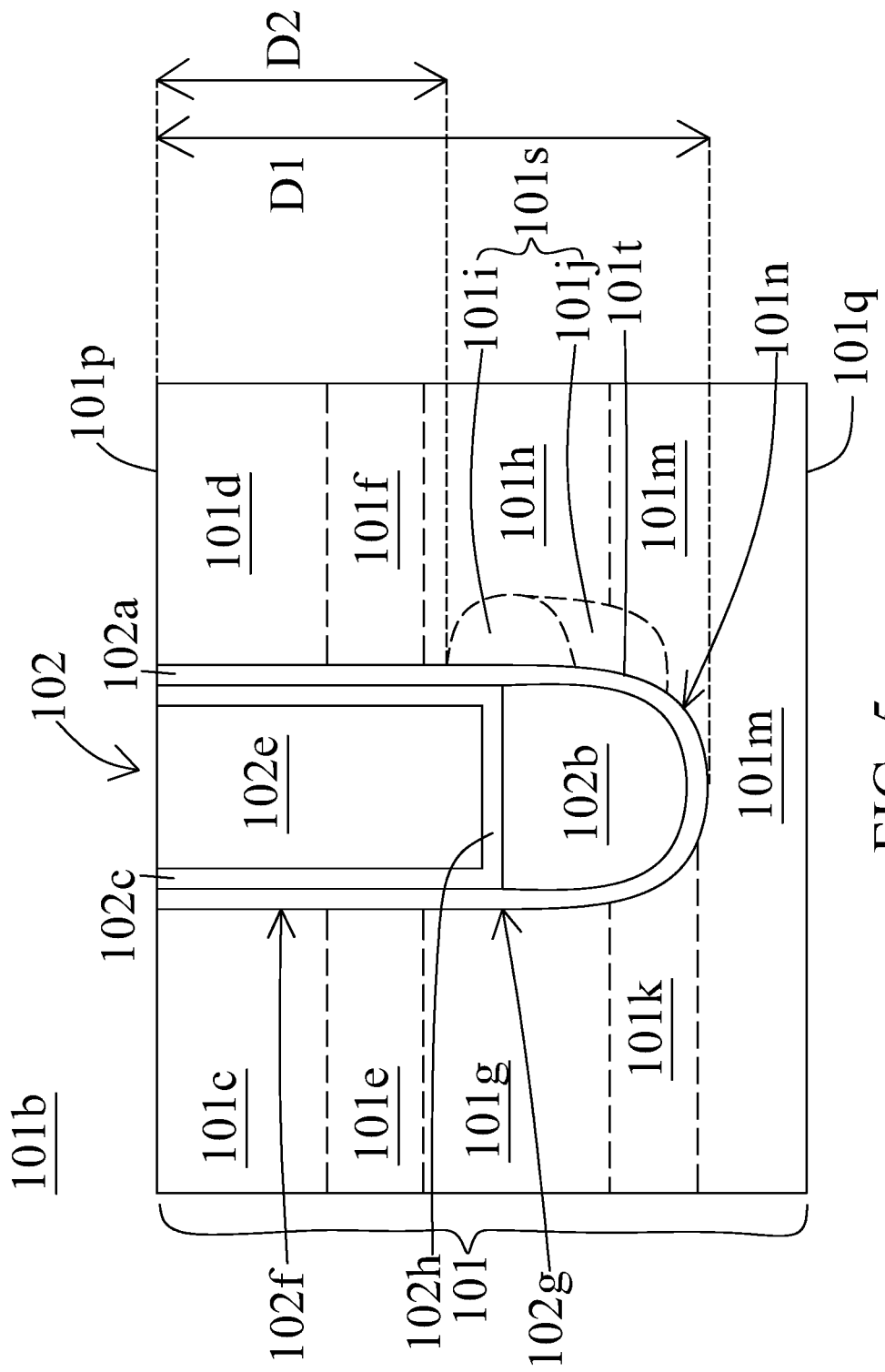
FIG. 5 is a cross-sectional side view of an array area of the memory device along a line A-A' of FIG. 4.

FIG. 5 is a schematic cross-sectional view of the memory device 200 along a line A-A' in FIG. 4. In some embodiments, the semiconductor substrate 101 includes a trench 101n extending into the semiconductor substrate 101. The trench 101n extends from the first surface 101p toward the second surface 101q. In some embodiments, a depth D1 of the trench 101n is about 120 nm to about 200 nm.

In some embodiments, the memory device 200 includes a word line 102 disposed within the trench 101n. In some embodiments, the word line 102 includes a gate oxide 102a conformal to the trench 101n, a gate electrode 102b over the gate oxide 102a, a buffering dielectric 102c over the gate electrode 102b, and a capping dielectric 102e surrounded by the buffering dielectric 102c. In some embodiments, the depth D1 of the word line 102n is about 120 nm to about 200 nm.

In some embodiments, the gate oxide 102a is disposed along an entire sidewall of the trench 101n. In some embodiments, the gate oxide 102a includes dielectric material such as oxide. In some embodiments, the gate oxide 102a is formed of an insulating material, such as silicon oxide, silicon nitride, silicon oxynitride, the like, or a combination thereof. In some embodiments, the gate oxide 102a includes dielectric material with a low dielectric constant (low k).

In some embodiments, the gate electrode 102b is disposed within the trench 101n and on the gate oxide 102a. In some embodiments, the gate electrode 102b is surrounded by the gate oxide 102a. In some embodiments, the gate electrode 102b includes conductive material such as tungsten (W).

In some embodiments, the buffering dielectric 102c is conformal to the gate oxide 102a and on the gate electrode 102b. In some embodiments, the buffering dielectric 102c is conformal to a top surface of the gate electrode 102b. In some embodiments, the buffering dielectric 102c and the gate oxide 102a include same or different materials. In some embodiments, the buffering dielectric 102c is formed of an insulating material, such as silicon oxide, silicon nitride, silicon oxynitride, the like, or a combination thereof. In some embodiments, the buffering dielectric 102c includes dielectric material with a low dielectric constant (low k).

In some embodiments, the capping dielectric 102e is disposed over the gate electrode 102b and surrounded by the gate oxide 102a and the buffering dielectric 102c. In some embodiments, the capping dielectric 102e is disposed within the trench 101n. In some embodiments, the capping dielectric 102e includes dielectric material such as nitride. In some embodiments, a top surface of the capping dielectric 102e is exposed through the first surface 101p of the semiconductor substrate 101.

In some embodiments, the semiconductor substrate 101 is defined with a source region 101c and a drain region 101d opposite to the source region 101c. In some embodiments, the word line 102 is disposed between the source region 101c and the drain region 101d. In some embodiments, the source region 101c and the drain region 101d are disposed over or under the first surface 101p of the semiconductor substrate 101. In some embodiments, the source region 101c and the drain region 101d at least partially surround an upper portion 102f of the word line 102. In some embodiments, the source region 101c is electrically connected to a bit line or a bit line contact. In some embodiments, the drain region 101d is electrically connected to a cell capacitor or a cell capacitor contact. In some embodiments, a depth of the source region 101c is substantially greater than a depth of the drain region 101d.

In some embodiments, the source region 101c and the drain region 101d are active areas of the semiconductor substrate 101. In some embodiments, the source region 101c and the drain region 101d are doped regions doped with a same type of dopants. In some embodiments, the source region 101c and the drain region 101d have a same conductivity type. In some embodiments, the source region 101c and the drain region 101d include N-type dopants such as phosphorus or the like.

In some embodiments, the semiconductor substrate 101 is further defined with a first heavily doped region 101e under the source region 101c and a second heavily doped region 101f under the drain region 101d. In some embodiments, the first heavily doped region 101e and the second heavily doped region 101f are doped regions doped with a same type of dopants. In some embodiments, the first heavily doped region 101e and the second heavily doped region 101f have a same conductivity type. In some embodiments, the first heavily doped region 101e and the second heavily doped region 101f include N-type dopants such as phosphorus or the like.

In some embodiments, the first heavily doped region 101e has a doping concentration less than that of the source region 101c. In some embodiments, the second heavily doped region 101f has a doping concentration less than that of the drain region 101d. In some embodiments, the doping concentration of the first heavily doped region 101e is substantially same as the doping concentration of the second heavily doped region 101f.

In some embodiments, the semiconductor substrate 101 is further defined with a first lightly doped region 101g under the source region 101c and a second lightly doped region 101h under the drain region 101d. In some embodiments, the first lightly doped region 101g is under the first heavily doped region 101e, and the second lightly doped region 101h is under the second heavily doped region 101f.

In some embodiments, the first lightly doped region 101g and the second lightly doped region 101h are doped regions doped with a same type of dopants. In some embodiments, the first lightly doped region 101g and the second lightly doped region 101h have a same conductivity type. In some embodiments, the first lightly doped region 101g and the second lightly doped region 101h include N-type dopants such as phosphorus or the like.

In some embodiments, the first lightly doped region 101g has a doping concentration less than that of the source region 101c and less than that of the first heavily doped region 101e. In some embodiments, the second lightly doped region 101h has a doping concentration less than that of the drain region 101d and less than that of the second heavily doped region 101f. In some embodiments, the doping concentration of the first lightly doped region 101g is substantially same as the doping concentration of the second lightly doped region 101h.

In some embodiments, the semiconductor substrate 101 is further defined with an ultra-lightly doped region 101s under the drain region 101d. In some embodiments, the ultra-lightly doped region 101s is under the second heavily doped region 101f and the second lightly doped region 101h. In some embodiments, the second heavily doped region 101f and the second lightly doped region 101h are disposed between the drain region 101d and the ultra-lightly doped region 101s, and the second heavily doped region 101f is disposed between the drain region 101d and the second lightly doped region 101h.

In some embodiments, the ultra-lightly doped region 101s is disposed at a sidewall 101t of the trench 101n. In some embodiments, the ultra-lightly doped region 101s at least partially surrounds a lower portion 102g of the word line 102. In some embodiments, the ultra-lightly doped region 101s is below the first surface 101p of the semiconductor substrate 101 by a distance D2, wherein the distance D2 is about 20 nm to about 80 nm. In some embodiments, the ultra-lightly doped region 101s is adjacent to a bottom portion 102h of the buffering dielectric 102c, wherein the bottom portion 102h contacts the gate electrode 102b and the capping dielectric 102e. In some embodiments, the ultra-lightly doped region 101s is disposed between the word line 102 and the second lightly doped region 101h. In some embodiments, the ultra-lightly doped region 101s is partially surrounded by the second lightly doped region 101h.

In some embodiments, the ultra-lightly doped region 101s is doped with dopants that are same as or different from dopants of the source region 101c, the drain region 101d, the first heavily doped region 101e, the second heavily doped region 101f, the first lightly doped region 101g and the second lightly doped region 101h. In some embodiments, the ultra-lightly doped region 101s has a conductivity type that is same as or different from those of the source region 101c, the drain region 101d, the first heavily doped region 101e, the second heavily doped region 101f, the first lightly doped region 101g and the second lightly doped region 101h. In some embodiments, the ultra-lightly doped region 101s includes N-type dopants such as phosphorus or the like. In some embodiments, the ultra-lightly doped region 101s includes P-type dopants such as boron or the like.

In some embodiments, the ultra-lightly doped region 101s has a doping concentration less than those of the source region 101c, the first heavily doped region 101e, the second heavily doped region 101f, the first lightly doped region 101g, and the second lightly doped region 101h. The doping concentration of the second heavily doped region 101f is substantially less than the doping concentration of the drain region 101d and is substantially greater than the doping concentration of the ultra-lightly doped region 101s.

The doping concentration of the second lightly doped region 101h is substantially less than the doping concentration of the second heavily doped region 101f and is substantially greater than the doping concentration of the ultra-lightly doped region 101s. In some embodiments, the doping concentration of the ultra-lightly doped region 101s is about $10^{16}$ per cm$^3$ to about $10^{18}$ per cm$^3$.

In some embodiments, the ultra-lightly doped region 101s includes a first ultra-lightly doped region 101i having a first conductivity type and a second ultra-lightly doped region 101j having a second conductivity type different from the first conductivity type. In some embodiments, the first ultra-lightly doped region 101i includes N-type dopants, and the second ultra-lightly doped region 101j includes P-type dopants. In some embodiments, the first ultra-lightly doped region 101i has a doping concentration substantially same as that of the second ultra-lightly doped region 101j. In some embodiments, the first ultra-lightly doped region 101i is disposed above the second ultra-lightly doped region 101j.

In some embodiments, the semiconductor substrate 101 is further defined with a third heavily doped region 101k under the first lightly doped region 101g. In some embodiments, the third heavily doped region 101k has a conductivity type different from those of the source region 101c, the drain region 101d, the first heavily doped region 101e, the second heavily doped region 101f, the first lightly doped region 101g, the second lightly doped region 101h and the ultra-lightly doped region 101s. In some embodiments, the third heavily doped region 101k includes P-type dopants such as boron or the like.

In some embodiments, the third heavily doped region 101k has a conductivity type same as that of the second ultra-lightly doped region 101j. In some embodiments, the third heavily doped region 101k includes P-type dopants such as boron or the like. In some embodiments, the third heavily doped region 101k has a doping concentration substantially greater than that of the ultra-lightly doped region 101s. In some embodiments, the third heavily doped region 101k has a doping concentration substantially greater than that of the second ultra-lightly doped region 101j.

In some embodiments, the semiconductor substrate 101 is further defined with a third lightly doped region 101m under the word line 102, the ultra-lightly doped region 101s, the second lightly doped region 101h and the third heavily doped region 101k. In some embodiments, the third lightly doped region 101m has a conductivity type different from those of the source region 101c, the drain region 101d, the first heavily doped region 101e, the second heavily doped region 101f, the first lightly doped region 101g, the second lightly doped region 101h and the ultra-lightly doped region 101s.

In some embodiments, the third lightly doped region 101m has a conductivity type same as that of the third heavily doped region 101k. In some embodiments, the third lightly doped region 101m has a conductivity type same as that of the second ultra-lightly doped region 101j. In some embodiments, the third lightly doped region 101m includes P-type dopants such as boron or the like.

In some embodiments, the third lightly doped region 101m has a doping concentration substantially greater than that of the ultra-lightly doped region 101s. In some embodiments, the doping concentration of the third lightly doped region 101m is substantially greater than that of the second ultra-lightly doped region 101j. In some embodiments, the doping concentration of the third lightly doped region 101m is substantially less than that of the third heavily doped region 101k.

Figure 6:
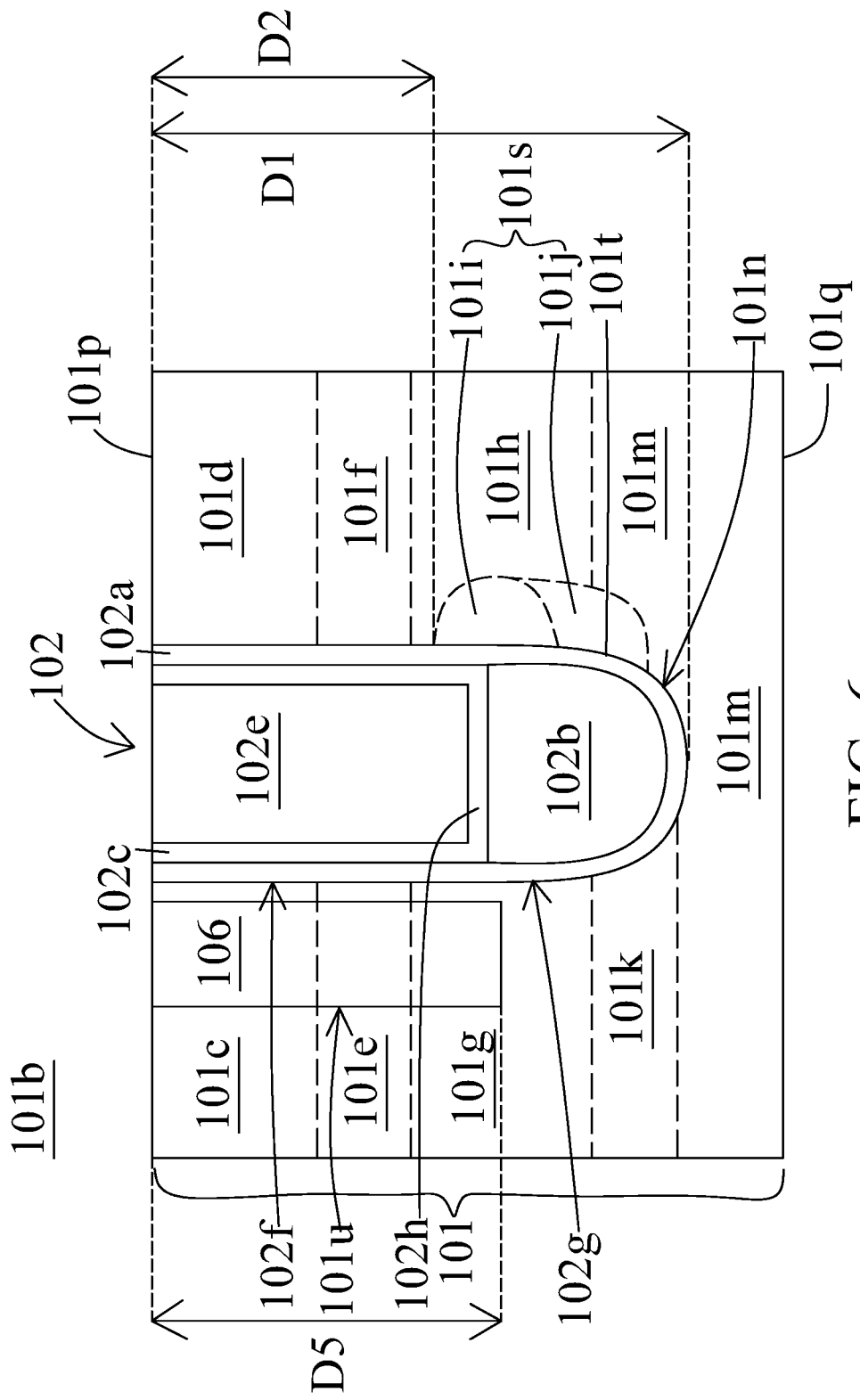
FIG. 6 is a cross-sectional side view of another embodiment of an array area of the memory device along the line A-A' of FIG. 4.

FIG. 6 illustrates another embodiment of the memory device 200 at the array area 101b. The embodiment shown in FIG. 6 is similar to the embodiment shown in FIG. 5, except a plug 106 is included in the embodiment shown in FIG. 6. In some embodiments, the plug 106 extends into the semiconductor substrate 101 and is disposed adjacent to the word line 102. In some embodiments, the plug 106 is disposed within a recess 101u, wherein the recess 101u extends into the semiconductor substrate 101 and is adjacent to the word line 102.

In some embodiments, the plug 106 includes semiconductive, conductive or insulating material such as silicon, titanium nitride (TiN), silicon nitride (SiN), silicon oxide (SiO) or tungsten (W). In some embodiments, the plug 106 is an electrical contact or a part of an electrical contact. In some embodiments, a depth D5 of the second recess 101u is about 10 nm to about 50 nm. In some embodiments, the depth D5 of the second recess 101u is substantially less than the depth D1 of the word line 102.

Figure 7:
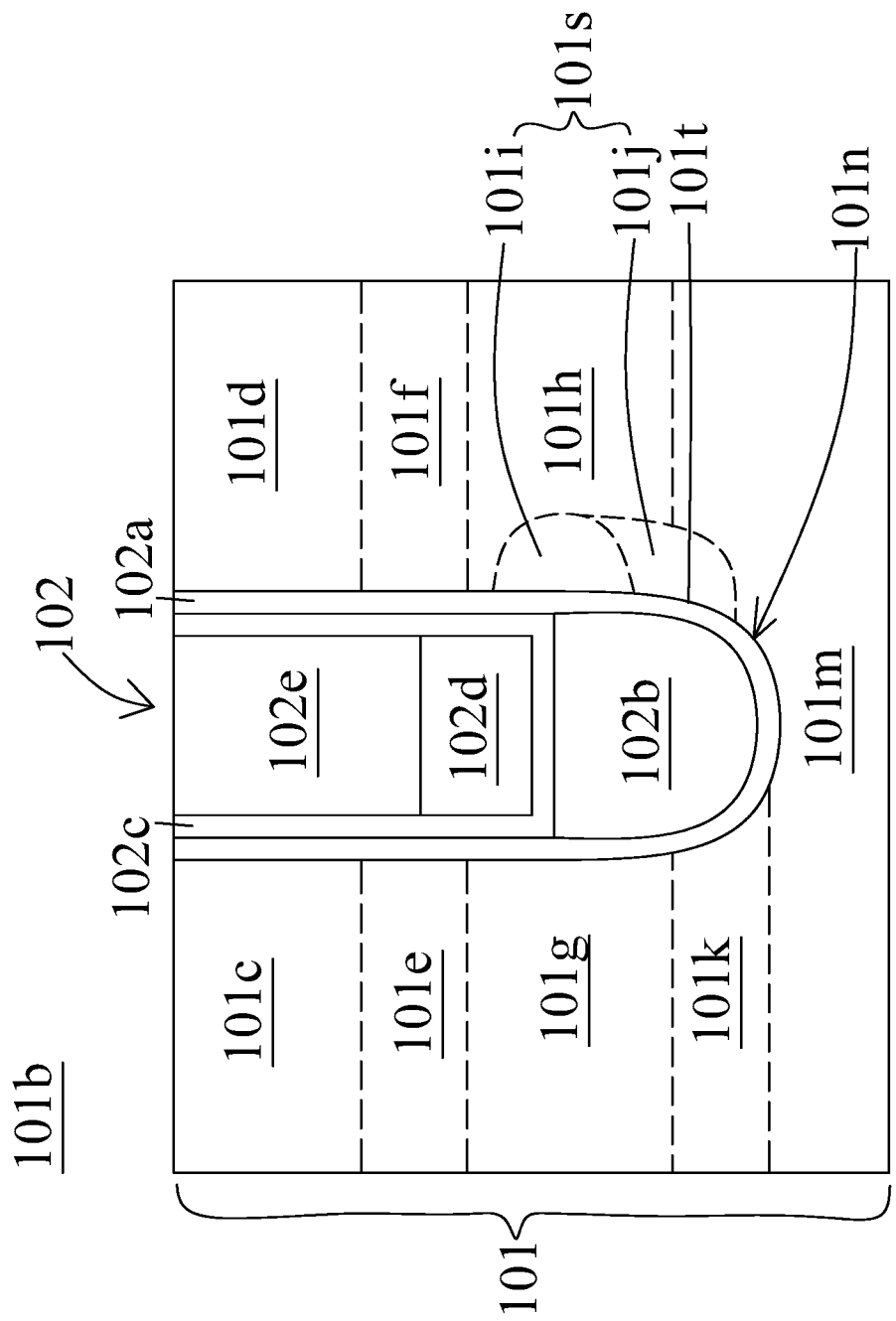
FIG. 7 is a cross-sectional side view of another embodiment of an array area of the memory device along the line A-A' of FIG. 4.

FIG. 7 illustrates another embodiment of the memory device 200 at the array area 101b. The embodiment shown in FIG. 7 is similar to the embodiment shown in FIG. 5, except a work function member 102d is included in the embodiment shown in FIG. 7. In some embodiments, the work function member 102d is disposed on and surrounded by the buffering dielectric 102c. In some embodiments, the work function member 102d is between the gate electrode 102b and the capping dielectric 102e. In some embodiments, the work function member 102d includes polysilicon or polycrystalline silicon.

In some embodiments, the memory device 200 further includes an isolation structure surrounding the word line 102. In some embodiments, the isolation structure extends into the semiconductor substrate 101 from the first surface 101p toward the second surface 101q. In some embodiments, the isolation structure is a shallow trench isolation (STI). In some embodiments, the isolation structure is formed of an insulating material, such as silicon oxide, silicon nitride, silicon oxynitride, the like, or a combination thereof.

Figure 8:
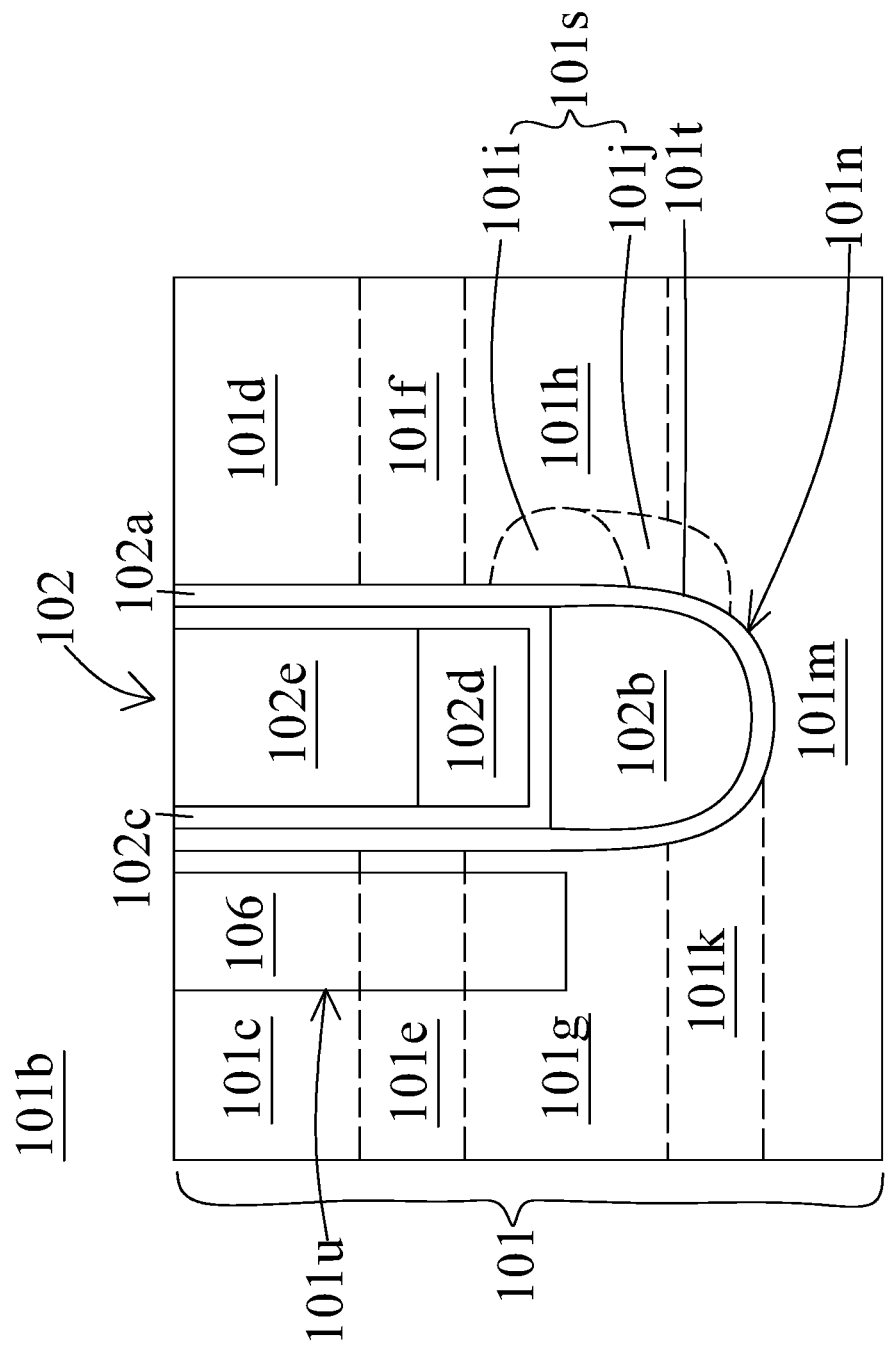
FIG. 8 is a cross-sectional side view of another embodiment of an array area of the memory device along the line A-A' of FIG. 4.

FIG. 8 illustrates another embodiment of the memory device 200 at the array area 101b. The embodiment shown in FIG. 8 is similar to the embodiment shown in FIG. 7, except the plug 106 is included in the embodiment shown in FIG. 8.

Figure 9:
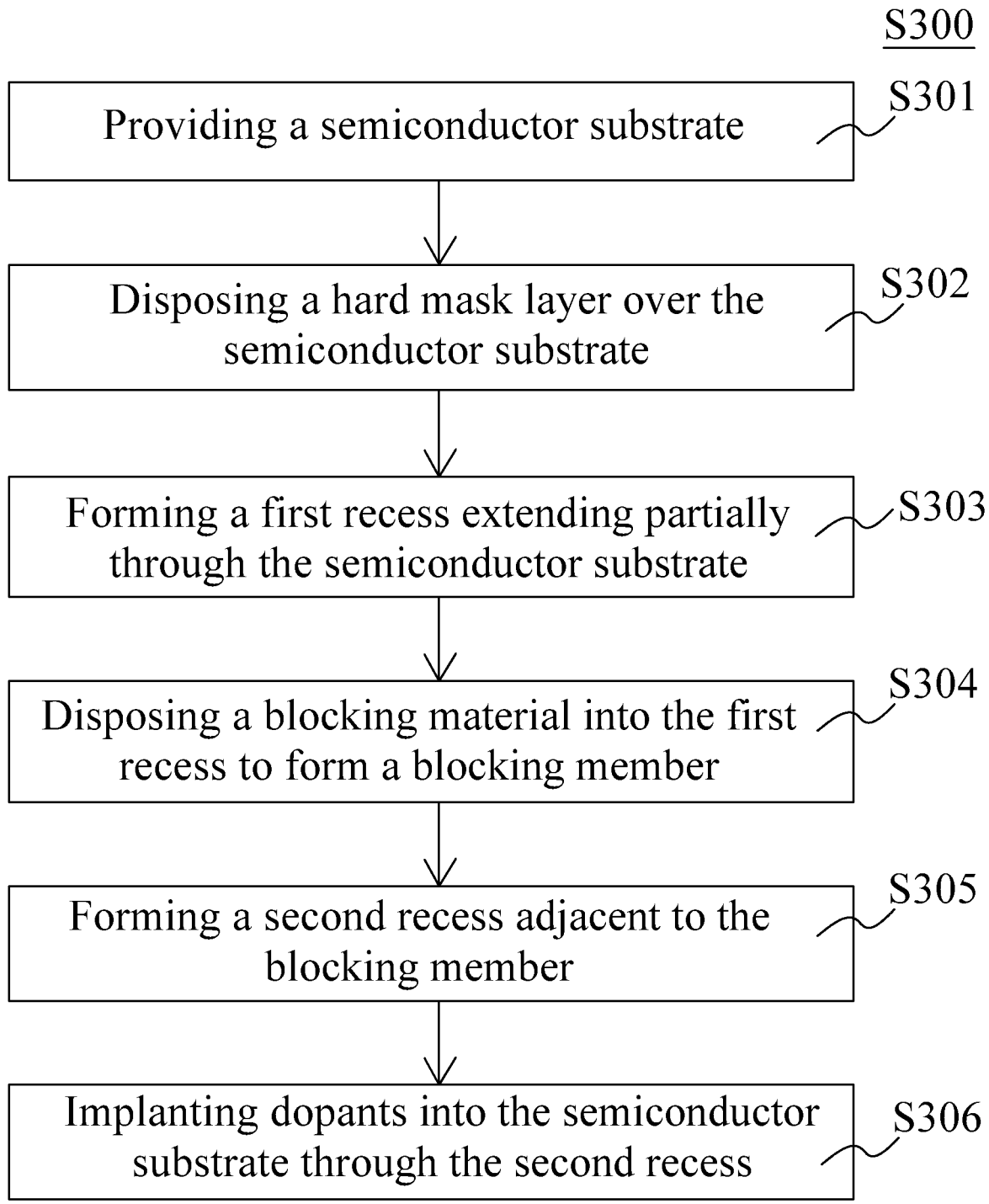
FIG. 9 is a flow diagram illustrating a method of manufacturing a semiconductor structure in accordance with some embodiments of the present disclosure.

FIG. 9 is a flow diagram illustrating a method S300 of manufacturing a semiconductor structure 100 in accordance with some embodiments of the present disclosure, and FIGS. 10 to 19 illustrate cross-sectional views of intermediate stages in formation of the semiconductor structure 100 in accordance with some embodiments of the present disclosure.

The stages shown in FIGS. 10 to 19 are also illustrated schematically in the flow diagram in FIG. 9. In following discussion, the fabrication stages shown in FIGS. 10 to 19 are discussed in reference to process steps shown in FIG. 9. The method S300 includes a number of operations, and description and illustration are not deemed as a limitation to a sequence of the operations. The method S300 includes a number of steps (S301, S302, S303, S304, S305 and S306).

The method S300 includes providing a semiconductor substrate (S301); disposing a hard mask layer over the semiconductor substrate 101 (S302); forming a first recess extending partially through the semiconductor substrate (S303); disposing a blocking material into the first recess to form a blocking member (S304); forming a second recess adjacent to the blocking member (S305); and implanting dopants into the semiconductor substrate through the second recess (S306).

Figure 10:
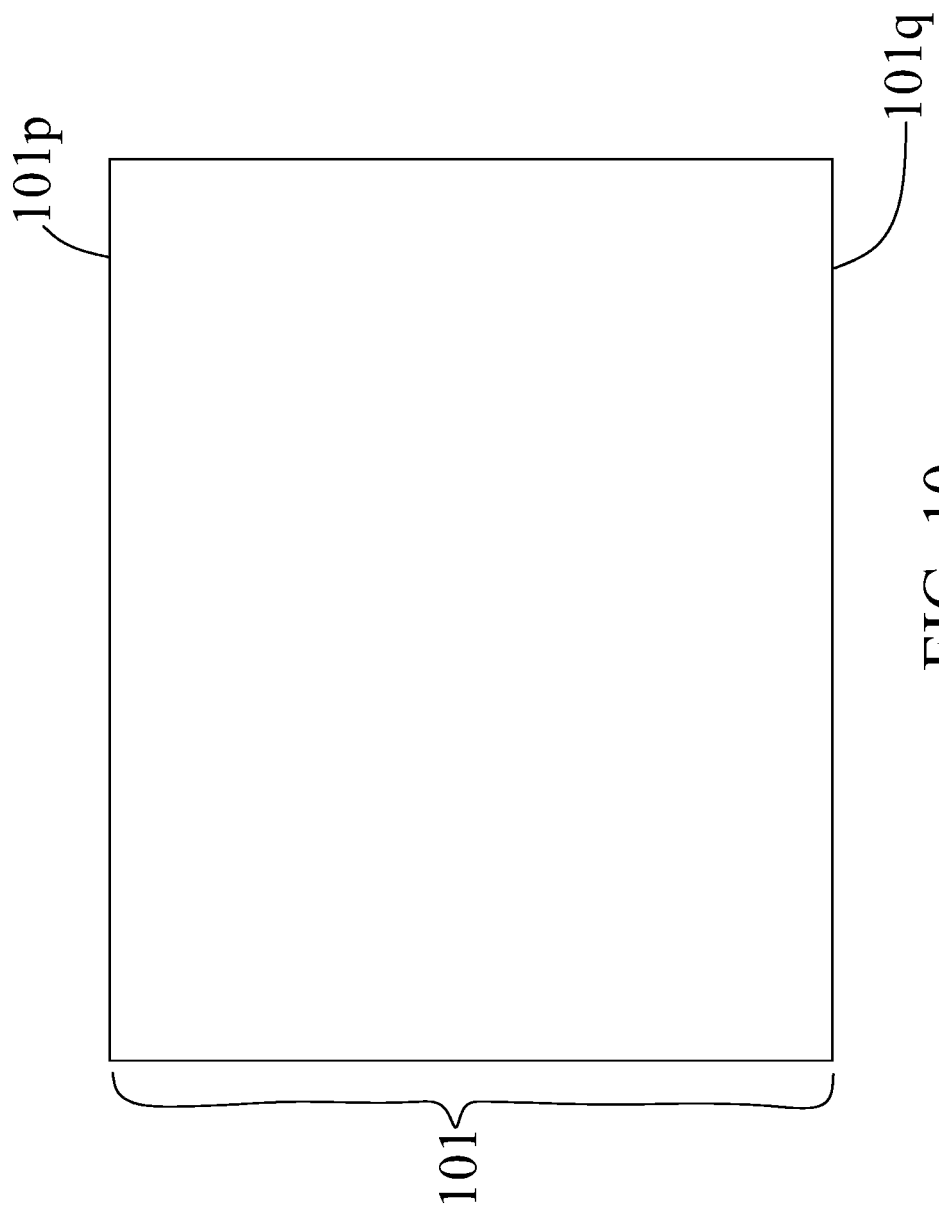
FIGS. 10 to 19 illustrate cross-sectional views of intermediate stages in the formation of a semiconductor structure in accordance with some embodiments of the present disclosure.

Referring to FIG. 10, a semiconductor substrate 101 is provided according to step S301 in FIG. 9. In some embodiments, the semiconductor substrate 101 includes semiconductive material such as silicon, germanium, gallium, arsenic, or a combination thereof. In some embodiments, the semiconductor substrate 101 includes bulk semiconductor material. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate.

In some embodiments, the semiconductor substrate 101 includes a first surface 101p and a second surface 101q opposite to the first surface 101p. In some embodiments, the first surface 101p is a front side of the semiconductor substrate 101, wherein electrical devices or components are subsequently formed over the first surface 101p and configured to electrically connect to an external circuitry. In some embodiments, the second surface 101q is a back side of the substrate 101, where electrical devices or components are absent.

Figure 11:
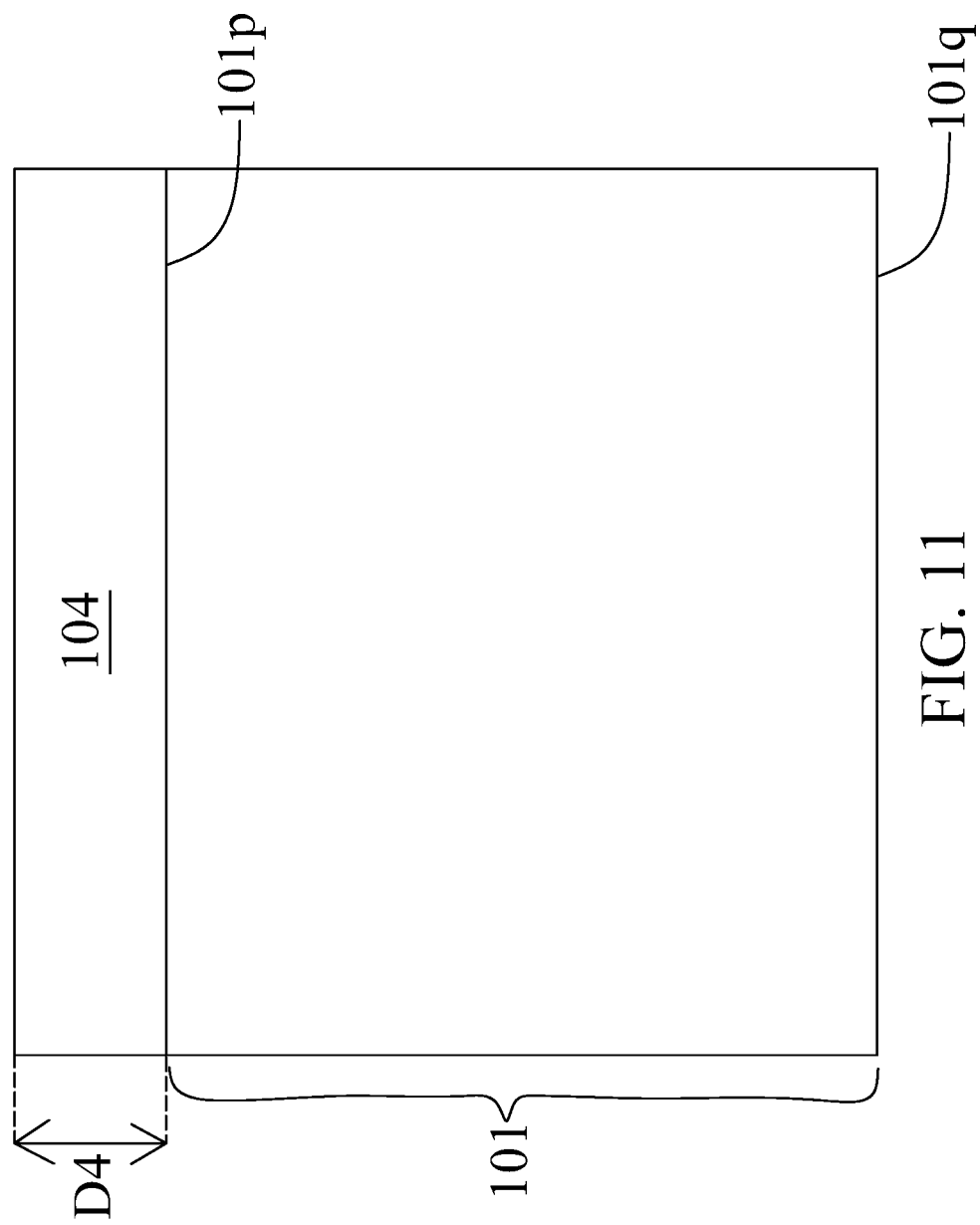

Referring to FIG. 11, a hard mask layer 104 over the semiconductor substrate 101 according to step S302 in FIG. 9. In some embodiments, the hard mask layer 104 is disposed over the first surface 101p of the semiconductor substrate 101. In some embodiments, the hard mask layer 104 includes nitride. In some embodiments, a thickness D4 of the hard mask layer 104 is about 30 nm to about 50 nm.

Figure 12:
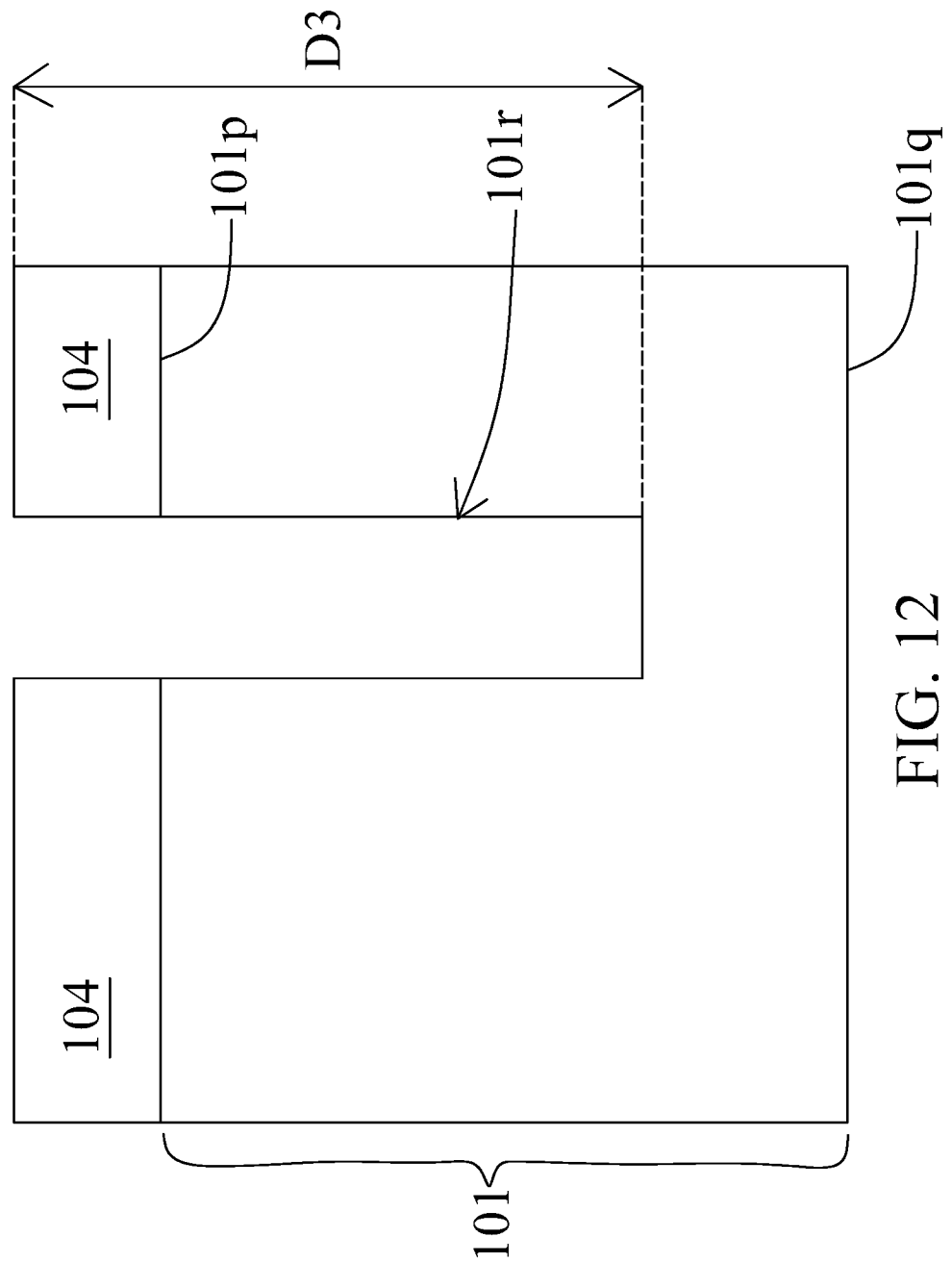

Referring to FIG. 12, a first recess 101r is formed according to step S303 in FIG. 9. In some embodiments, the formation of the first recess 101r includes removing a portion of the semiconductor substrate 101 and a portion of the hard mask layer 104 to form the first recess 101r. In some embodiments, the first recess 101r is formed by removing the portion of the hard mask layer 104 to expose at least the portion of the semiconductor substrate 101, and then removing the portion of the semiconductor substrate 101 exposed through the hard mask layer 104. In some embodiments, the removal of the portion of the hard mask layer 104 and the removal of the portion of the semiconductor substrate 101 can be implemented by etching or any other suitable process. In some embodiments, a depth D3 of the first recess 101r is about 20 nm to about 70 nm.

Figure 13:
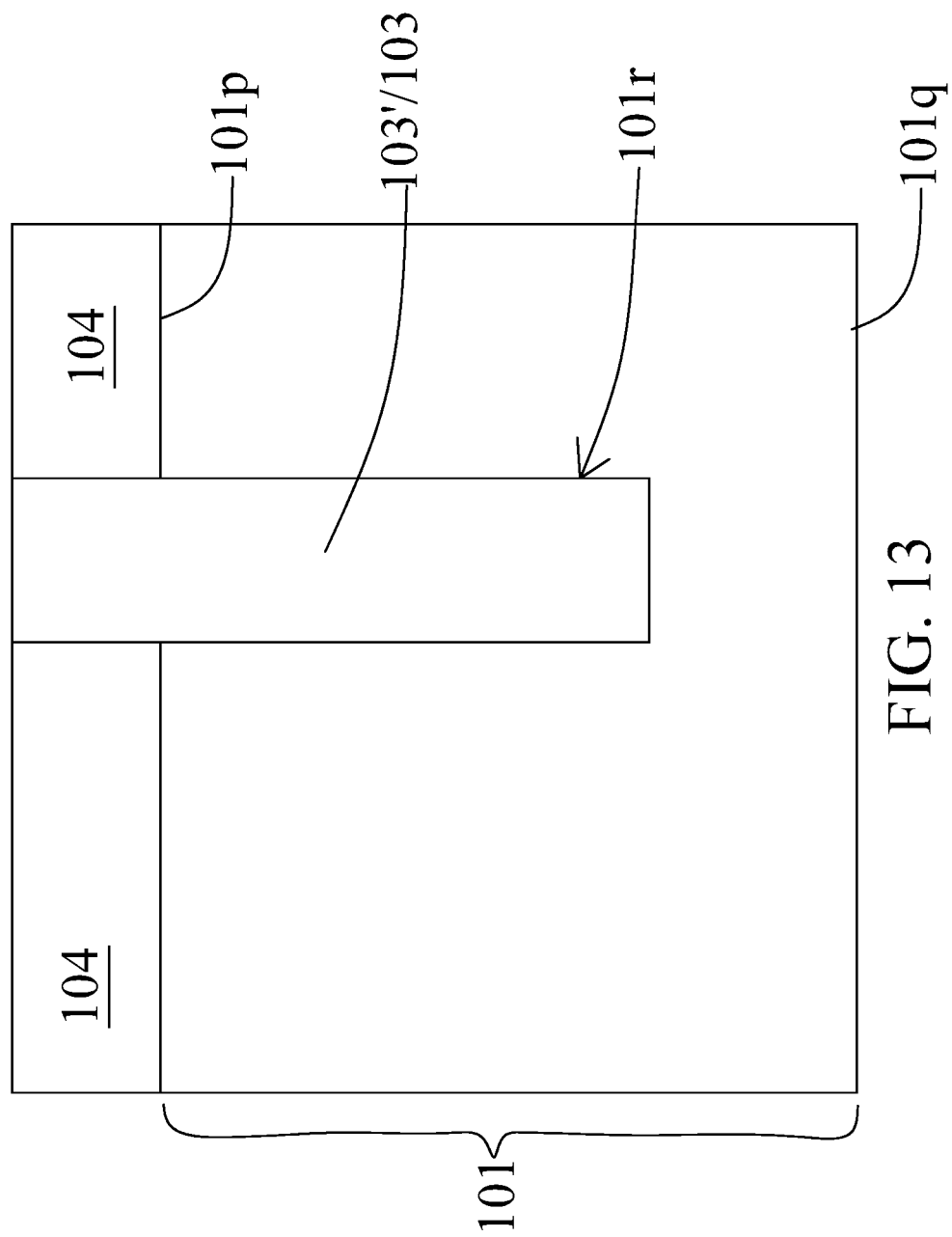

Referring to FIG. 13, a blocking material 103' is disposed into the first recess 101r according to step S304 in FIG. 9. The blocking material 103' is disposed into the first recess 101r to form a blocking member 103. In some embodiments, the blocking material 103' is disposed by deposition, CVD or any other suitable process. The blocking member 103 extends into the semiconductor substrate 101. In some embodiments, the blocking member 103 is partially surrounded by the hard mask layer 104. In some embodiments, the blocking material 103' includes titanium nitride (TiN), silicon nitride (SiN), silicon oxide (SiO) or tungsten (W).

Figure 14:
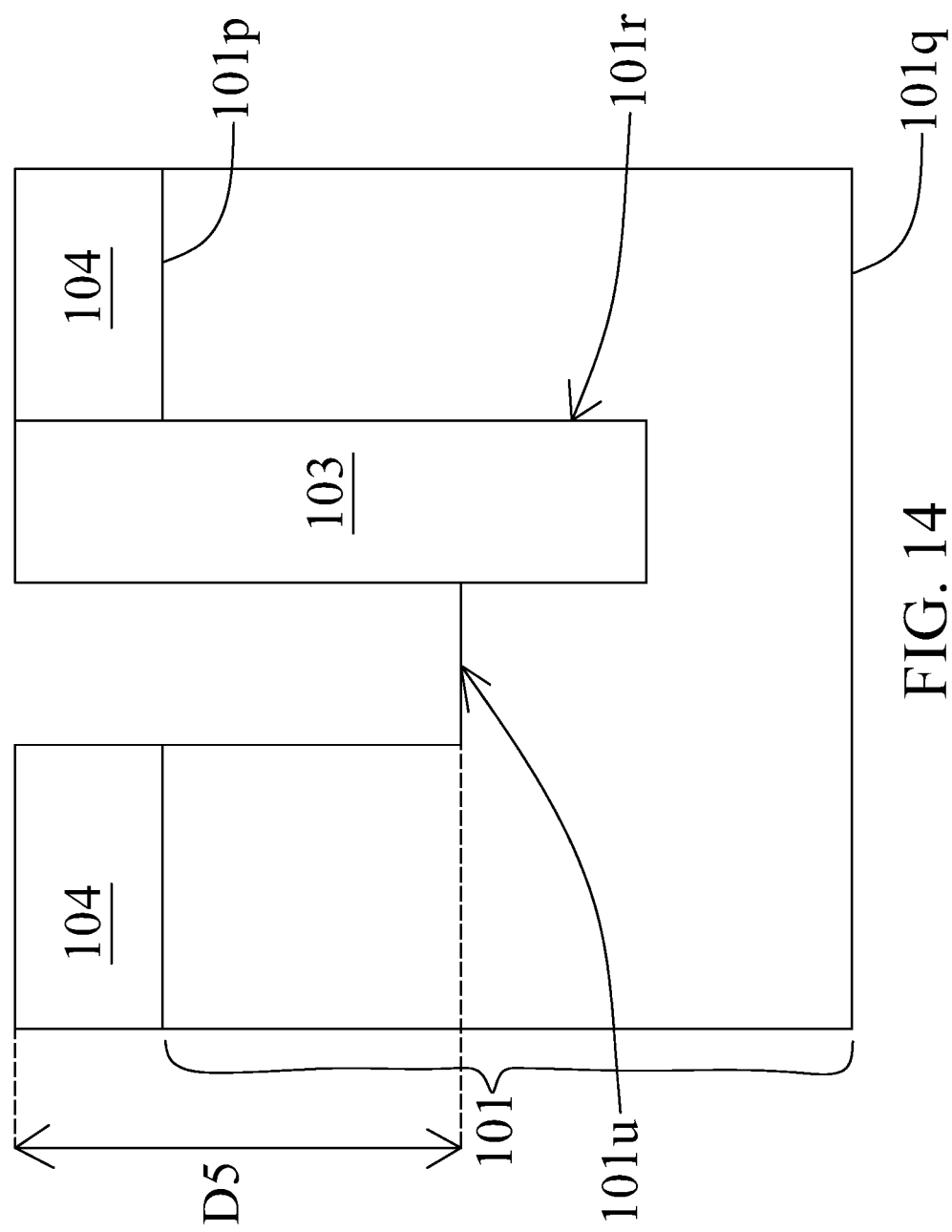

Referring to FIG. 14, a second recess 101u is formed according to step S305 in FIG. 9. In some embodiments, the second recess 101u is formed by removing a portion of the hard mask layer 104 to expose at least a portion of the semiconductor substrate 101, and then removing the portion of the semiconductor substrate 101 exposed through the hard mask layer 104. In some embodiments, the removal of the portion of the hard mask layer 104 and the removal of the portion of the semiconductor substrate 101 can be implemented by etching or any other suitable process.

In some embodiments, the second recess 101u is disposed adjacent to the blocking member 103 and extends partially through the semiconductor substrate 101. In some embodiments, the first recess 101r and the second recess 101u extend through the hard mask layer 104. In some embodiments, a depth D5 of the second recess 101u is about 10 nm to about 50 nm. In some embodiments, the depth D5 of the second recess 101u is substantially less than the depth D3 of the first recess 101r.

Figure 15:
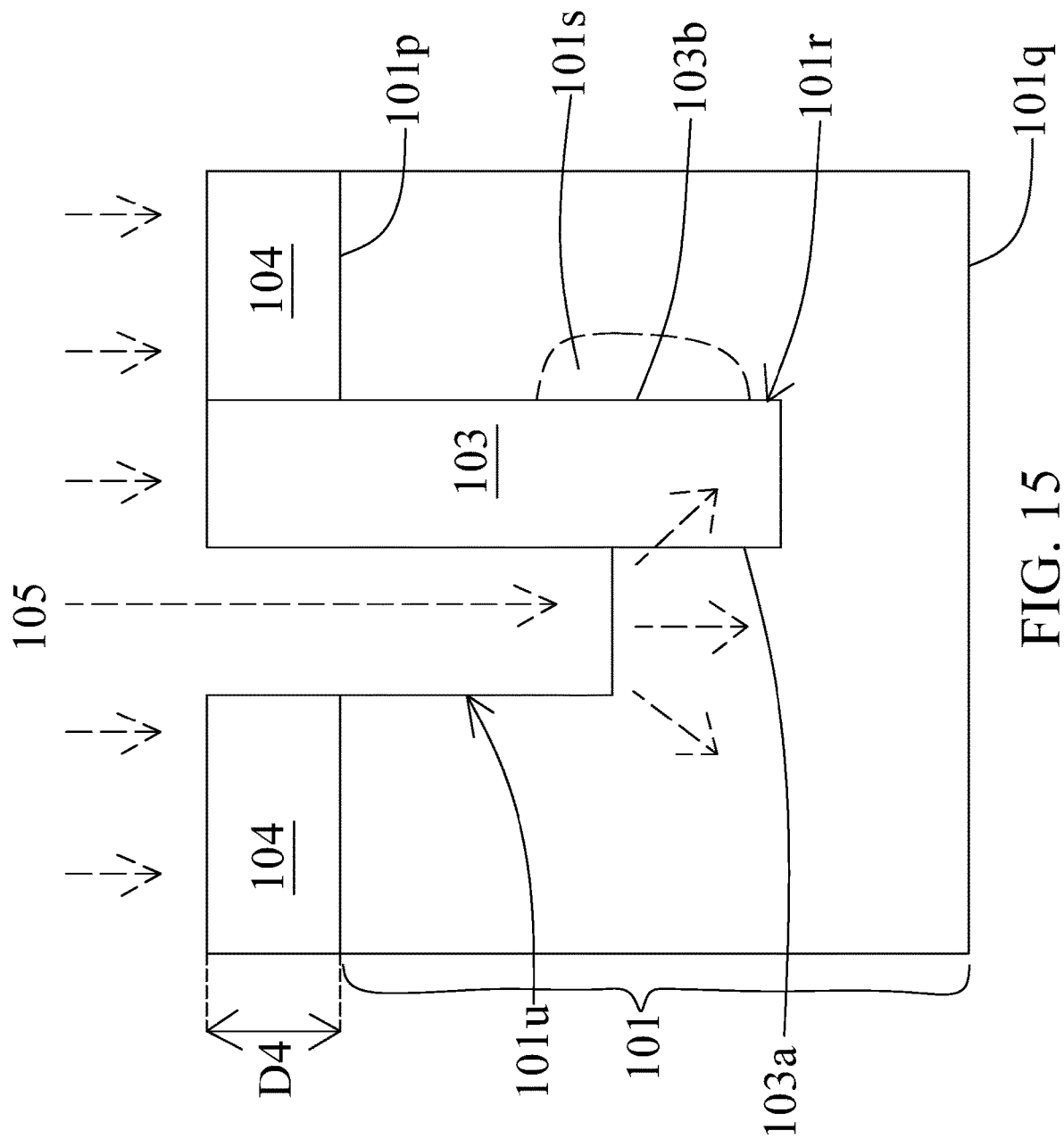

Referring to FIG. 15, dopants 105 are implanted into the semiconductor substrate 101 according to step S306 in FIG. 9. In some embodiments, the implantation of the dopants 105 is performed after the formation of the blocking member 103. In some embodiments, the dopants 105 are implanted into the semiconductor substrate 101 through the second recess 101u. The dopants 105 collide with the semiconductor substrate 101 exposed through the second recess 101u and diffuse across the blocking member 103 to form an ultra-lightly doped region 101s. In some embodiments, the dopants 105 diffuse from a third side 103a to a fourth side of the blocking member 103. In some embodiments, the ultra-lightly doped region 101s is formed over the fourth side 103b of the blocking member.

In some embodiments, as shown in FIG. 15, the dopants 105 travel toward the hard mask layer 104 and the first surface 101p of the semiconductor substrate 101. In some embodiments, the dopants 105 travel toward the hard mask layer 104 and the first surface 101p at an angle of about 5° to 10°. In some embodiments, the dopants 105 are N-type dopants or P-type dopants. In some embodiments, the dopants 105 include boron, phosphorous or arsenic.

The hard mask layer 104 can block the dopants 105 from being implanted into the semiconductor substrate 101. The dopants 105 are unable to pass through the hard mask layer 104. In some embodiments, the hard mask layer 104 has the thickness D4 preventing the dopants 105 from passing through the hard mask layer 104. In some embodiments, the dopants 105 possess kinetic energy insufficient to pass through the hard mask layer 104.

In some embodiments, the dopants 105 possess kinetic energy in a range of about 1 KeV to about 30 KeV. In some embodiments, the dopants 105 possess kinetic energy in a range of about 1 KeV to about 5 KeV. In some embodiments, the dopants 105 possess kinetic energy in a range of about 5 KeV to about 30 KeV.

In some embodiments, the dopants 105 travel toward the second recess 101u and enter into the semiconductor substrate 101, and then diffuse across the blocking member 103. In some embodiments, the dopants 105 are partially blocked by the blocking member 103. In some embodiments, the dopants 105 travel along or through the third side 103a of the blocking member 103 to the fourth side 103b of the blocking member 103.

Since the dopants 105 diffuse across the blocking member 103 or are partially blocked by the blocking member 103, a doping concentration of the dopants 105 at the third side 103a of the blocking member 103 is substantially greater than a doping concertation of the dopants 105 at the fourth side 103b of the blocking member 103. After the implantation of the dopants 105, the ultra-lightly doped region 101s is formed as shown in FIG. 15. In some embodiments, the doping concentration of the ultra-lightly doped region 101s is about $10^{16}$ per cm$^3$ to about $10^{18}$ per cm$^3$.

Figure 16:
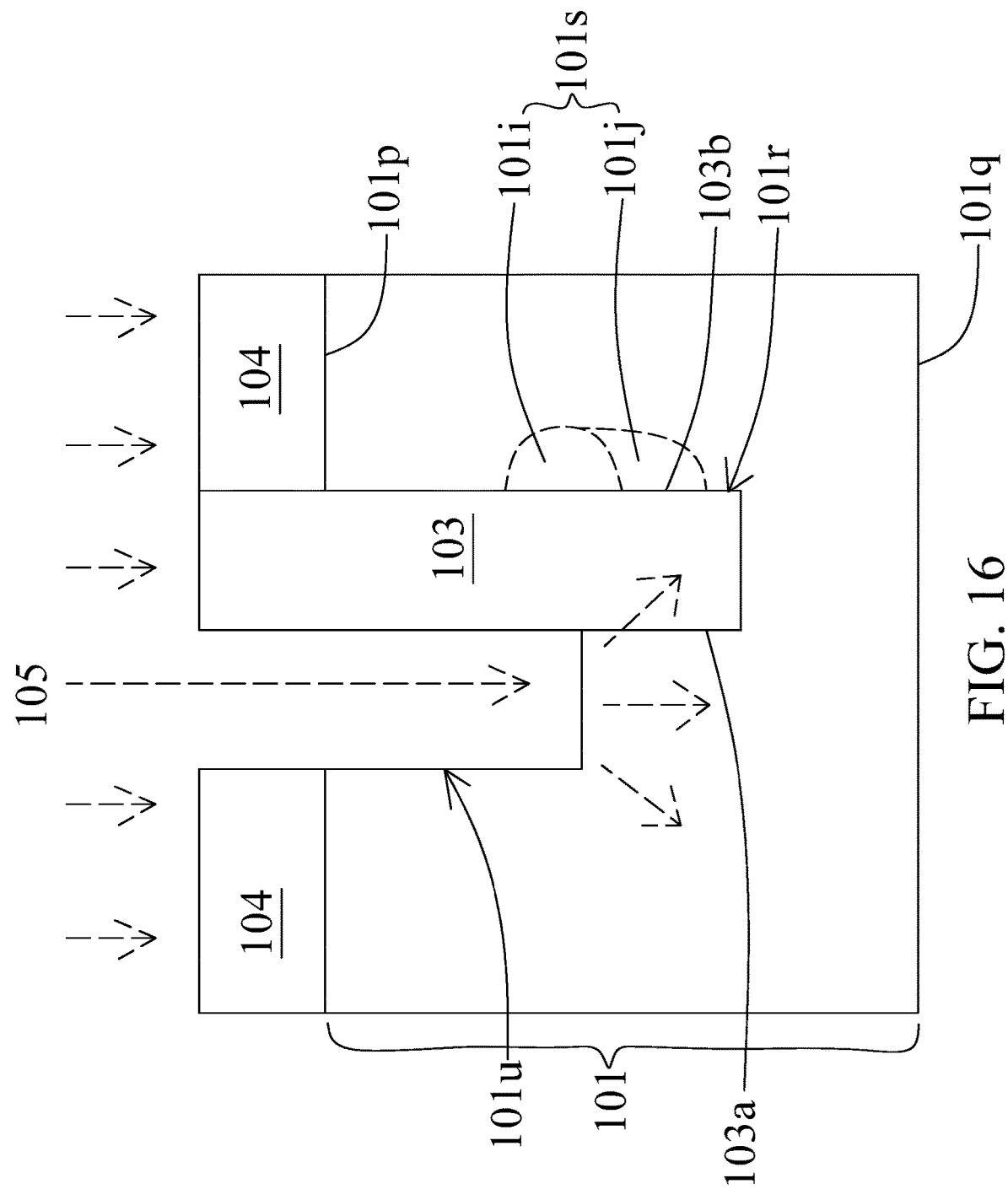

In some embodiments, the ultra-lightly doped region 101s is formed by implanting the dopants 105 in N-type to form a first ultra-lightly doped region 101i, and implanting the dopants 105 in P-type to form a second ultra-lightly doped region 101i, as shown in FIG. 16.

Figure 17:
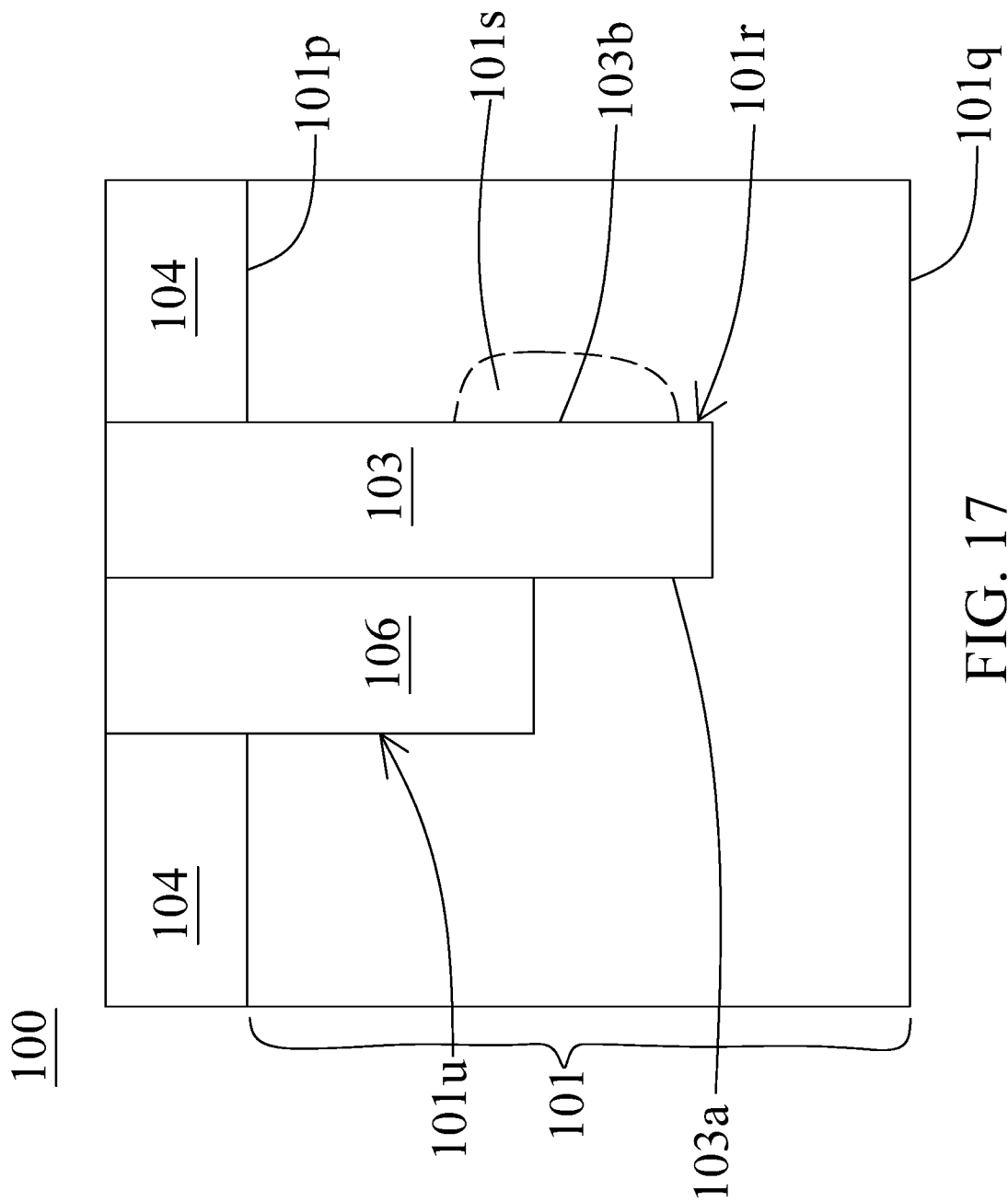

In some embodiments, a plug 106 is formed within the second recess 101u after the formation of the ultra-lightly doped region 101s as shown in FIG. 17. In some embodiments, the plug 106 is formed by disposing a material into the second recess 101u. In some embodiments, the material is semiconductive, conductive or insulative.

In some embodiments, the material includes silicon, titanium nitride (TiN), silicon nitride (SiN), silicon oxide (SiO) or tungsten (W). In some embodiments, the semiconductor structure 100 of FIG. 1 is formed. In some embodiments, the hard mask layer 104 is removed and the blocking member 103 and the plug 106 are planarized after the implantation of the dopants 105.

Figure 18:
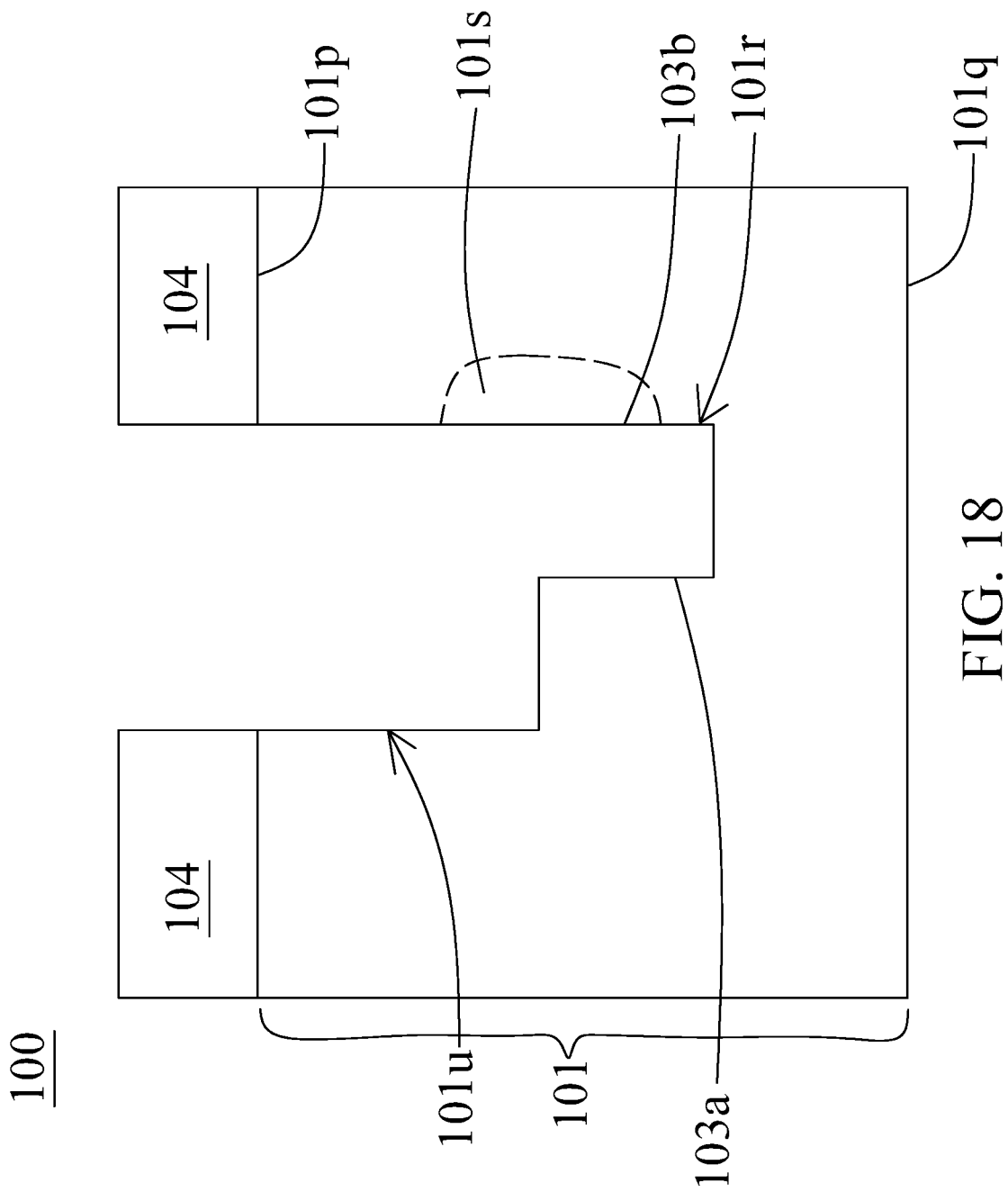
Figure 19:
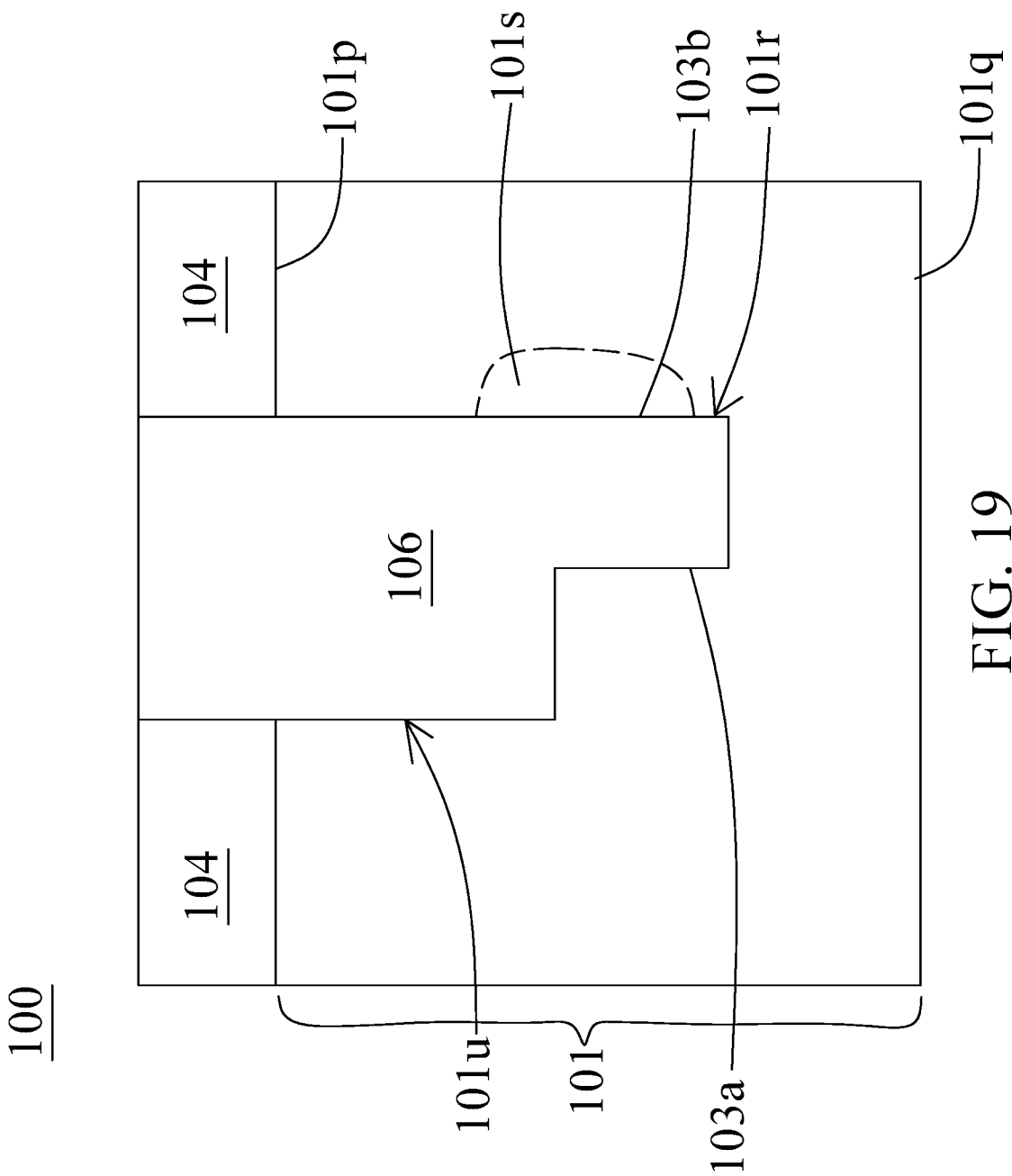

Alternatively, the blocking member 103 is removed after the implantation of the dopants 105 as shown in FIG. 18. In some embodiments, the blocking member 103 is removed by etching, stripping or any other suitable process. After the removal of the blocking member 103, a material fills the first recess 101r and the second recess 101u to form the plug 106 as shown in FIG. 19. In some embodiments, the semiconductor structure 100 of FIG. 3 is formed.

Figure 20:
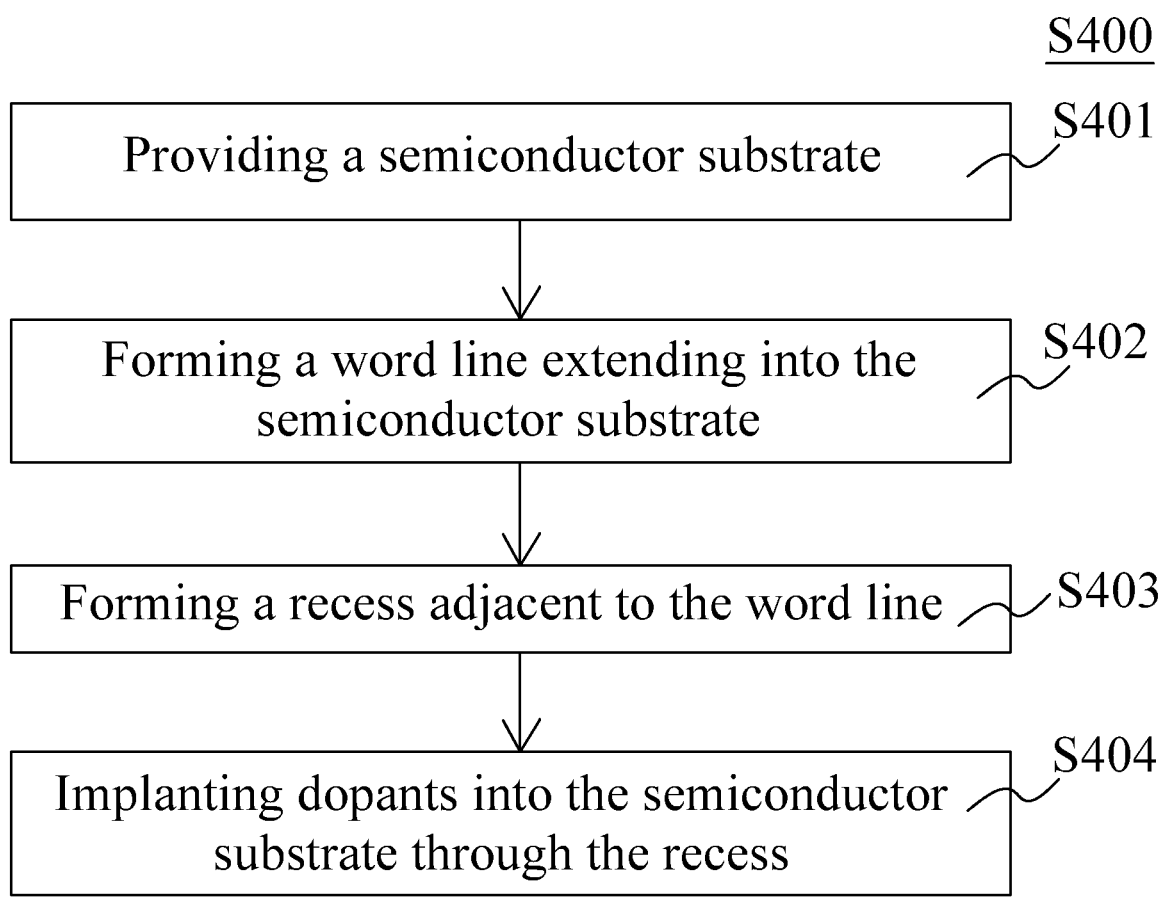
FIG. 20 is a flow diagram illustrating a method of manufacturing a memory device in accordance with some embodiments of the present disclosure.

FIG. 20 is a flow diagram illustrating a method S400 of manufacturing a memory device 200 in accordance with some embodiments of the present disclosure, and FIGS. 21 to 34 illustrate cross-sectional views of intermediate stages in formation of the memory device 200 in accordance with some embodiments of the present disclosure.

The stages shown in FIGS. 21 to 33 are also illustrated schematically in the flow diagram in FIG. 20. In following discussion, the fabrication stages shown in FIGS. 21 to 33 are discussed in reference to process steps shown in FIG. 20. The method S400 includes a number of operations, and description and illustration are not deemed as a limitation to a sequence of the operations. The method S400 includes a number of steps (S401, S402, S403, and S404).

The method S400 includes providing a semiconductor substrate (S401); forming a word line extending into the semiconductor substrate (S402); forming a recess adjacent to the word line (S403); and implanting dopants into the semiconductor substrate through the recess (S404).

Figure 21:
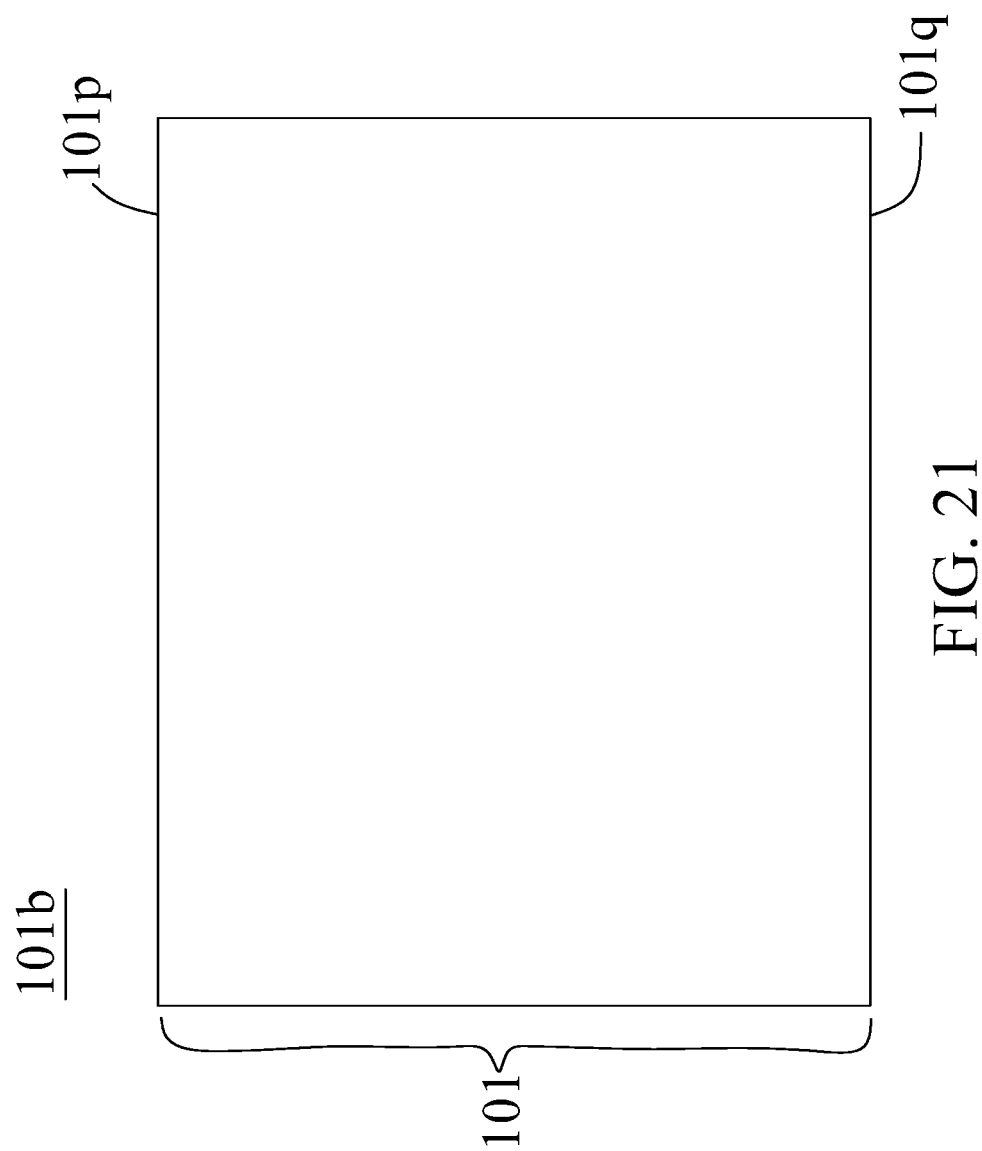
FIGS. 21 to 33 illustrate cross-sectional views of intermediate stages in the formation of a memory device in accordance with some embodiments of the present disclosure.

Referring to FIG. 21, a semiconductor substrate 101 is provided according to step S401 in FIG. 20. FIG. 21 illustrates an array area 101b of the semiconductor substrate 101. In some embodiments, the semiconductor substrate 101 includes semiconductive material such as silicon, germanium, gallium, arsenic, or a combination thereof. In some embodiments, the semiconductor substrate 101 includes bulk semiconductor material. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate.

In some embodiments, the semiconductor substrate 101 includes a first surface 101p and a second surface 101q opposite to the first surface 101p. In some embodiments, the first surface 101p is a front side of the semiconductor substrate 101, wherein electrical devices or components are subsequently formed over the first surface 101p and configured to electrically connect to an external circuitry. In some embodiments, the second surface 101q is a back side of the substrate 101, where electrical devices or components are absent.

Figure 22:
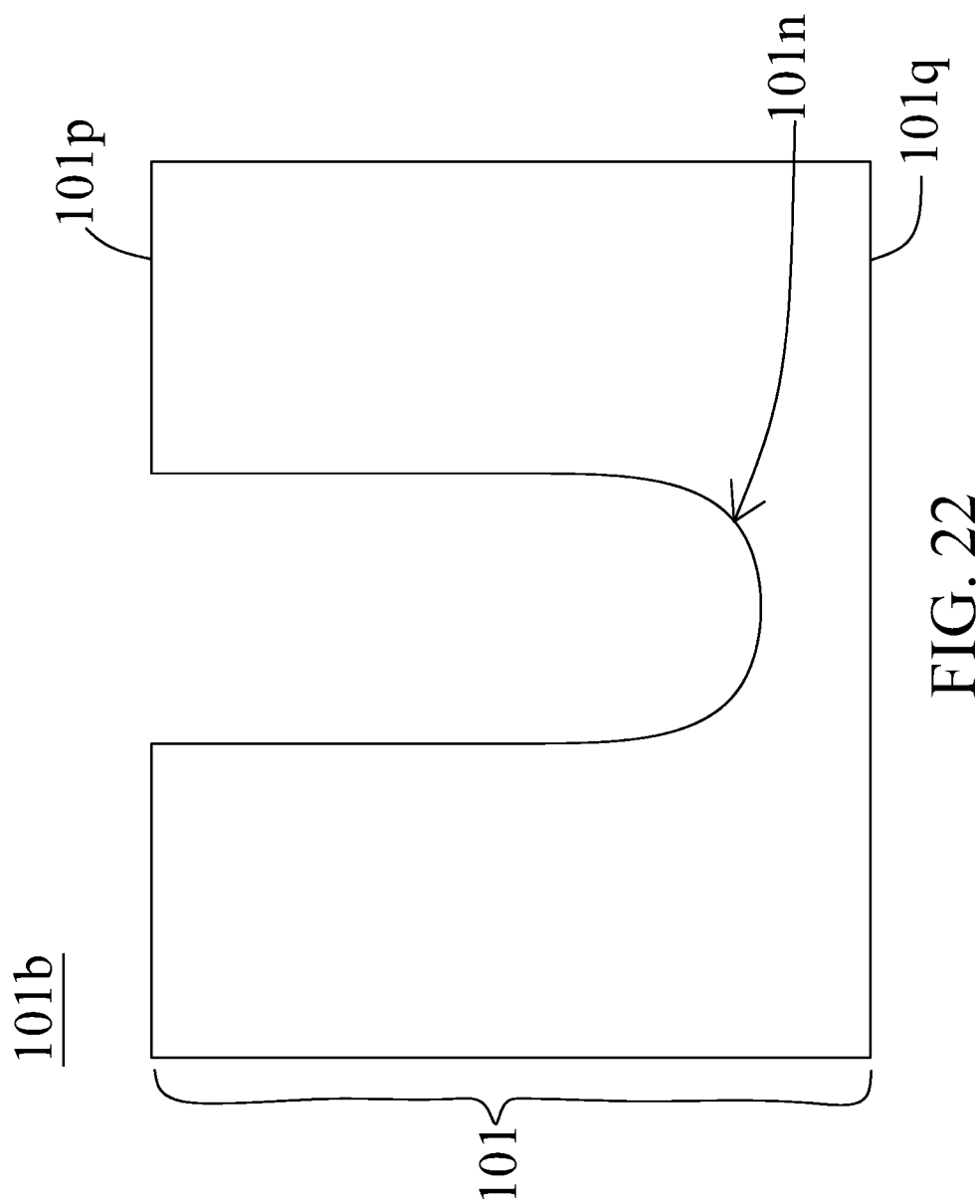

Referring to FIGS. 22 to 26, a word line 102 is formed according to step S402 in FIG. 20. In some embodiments, the word line 102 extends into the semiconductor substrate 101. In some embodiments, a trench 101n is formed prior to the formation of the word line 102 as shown in FIG. 22. In some embodiments, the trench 101n is formed by removing some portions of the semiconductor substrate 101.

Figure 23:
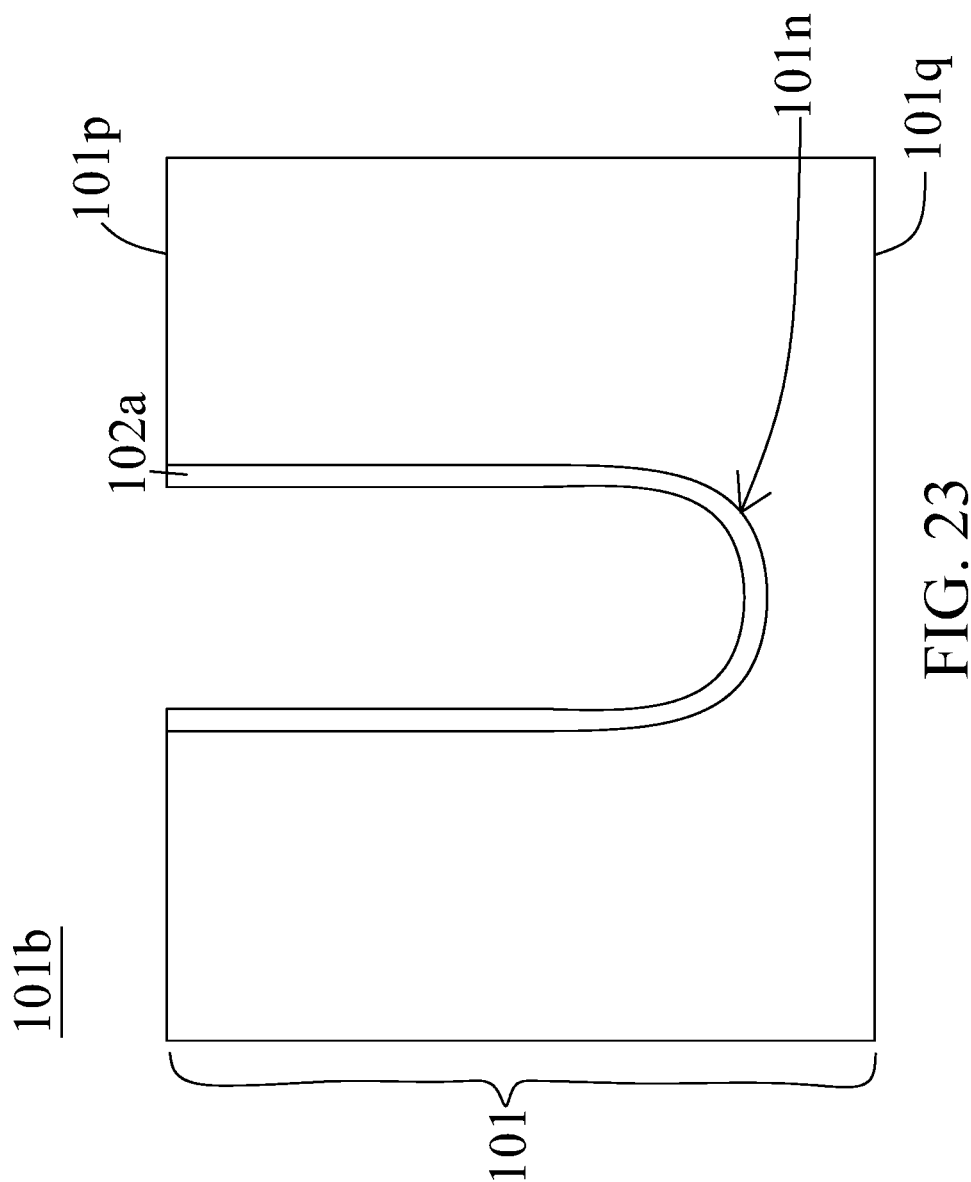

After the formation of the trench 101n, a gate oxide 102a is formed as shown in FIG. 23. In some embodiments, the gate oxide 102a is disposed by deposition, atomic layer deposition (ALD), chemical vapor deposition (CVD) or any other suitable process. The gate oxide 102a is formed within the trench 101n. In some embodiments, the gate oxide 102a is disposed along an entire sidewall of the trench 101n. In some embodiments, the gate oxide 102a includes dielectric material such as oxide. In some embodiments, the gate oxide 102a is formed of an insulating material, such as silicon oxide, silicon nitride, silicon oxynitride, the like, or a combination thereof. In some embodiments, the gate oxide 102a includes dielectric material with a low dielectric constant (low k).

Figure 24:
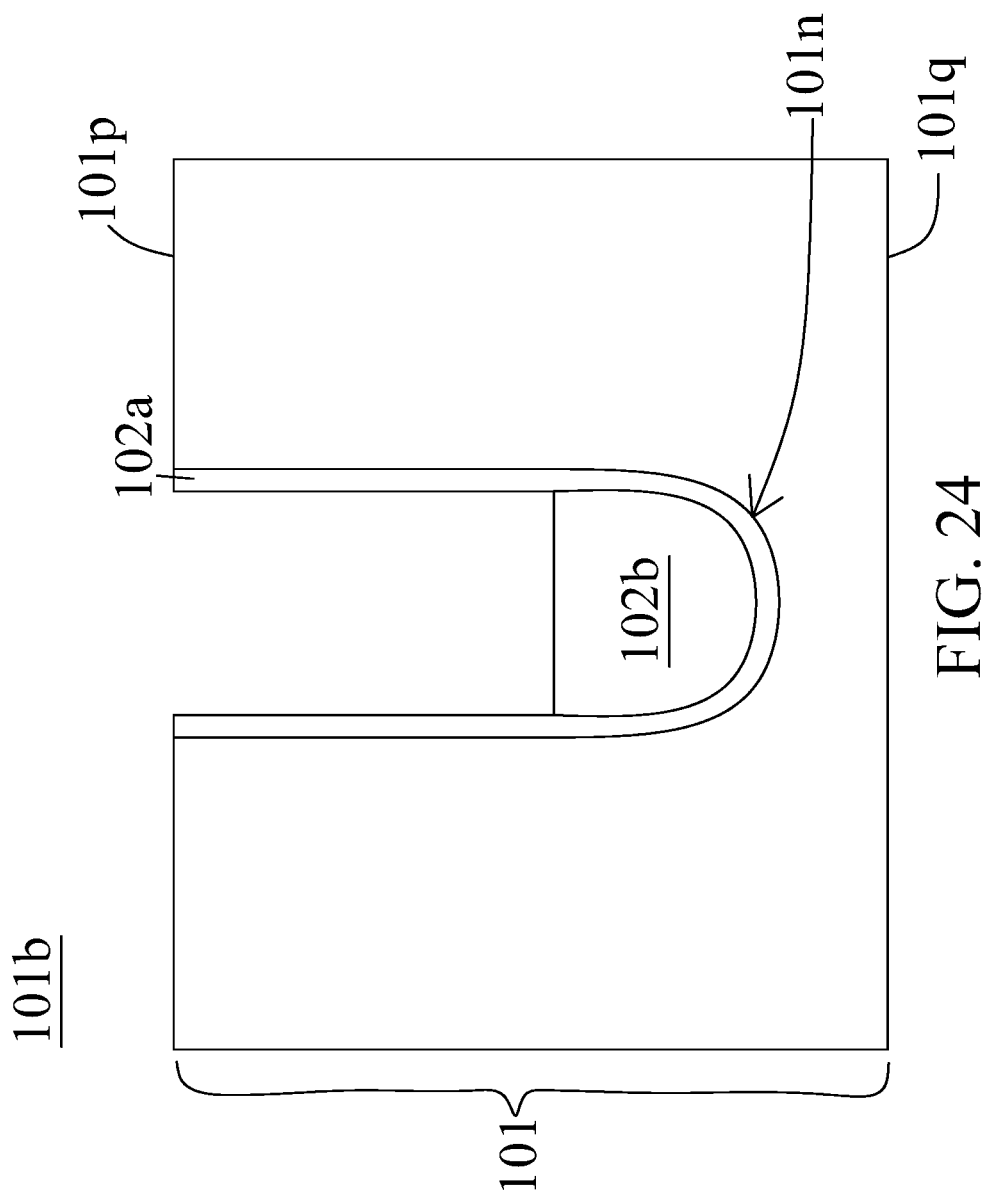

After the formation of the gate oxide 102a, a gate electrode 102b is formed as shown in FIG. 24. In some embodiments, the gate electrode 102b is disposed by deposition, CVD or any other suitable process. In some embodiments, the gate electrode 102b is surrounded by the gate oxide 102a and is disposed within the trench 101n. In some embodiments, the gate electrode 102b includes conductive material such as tungsten (W).

Figure 25:
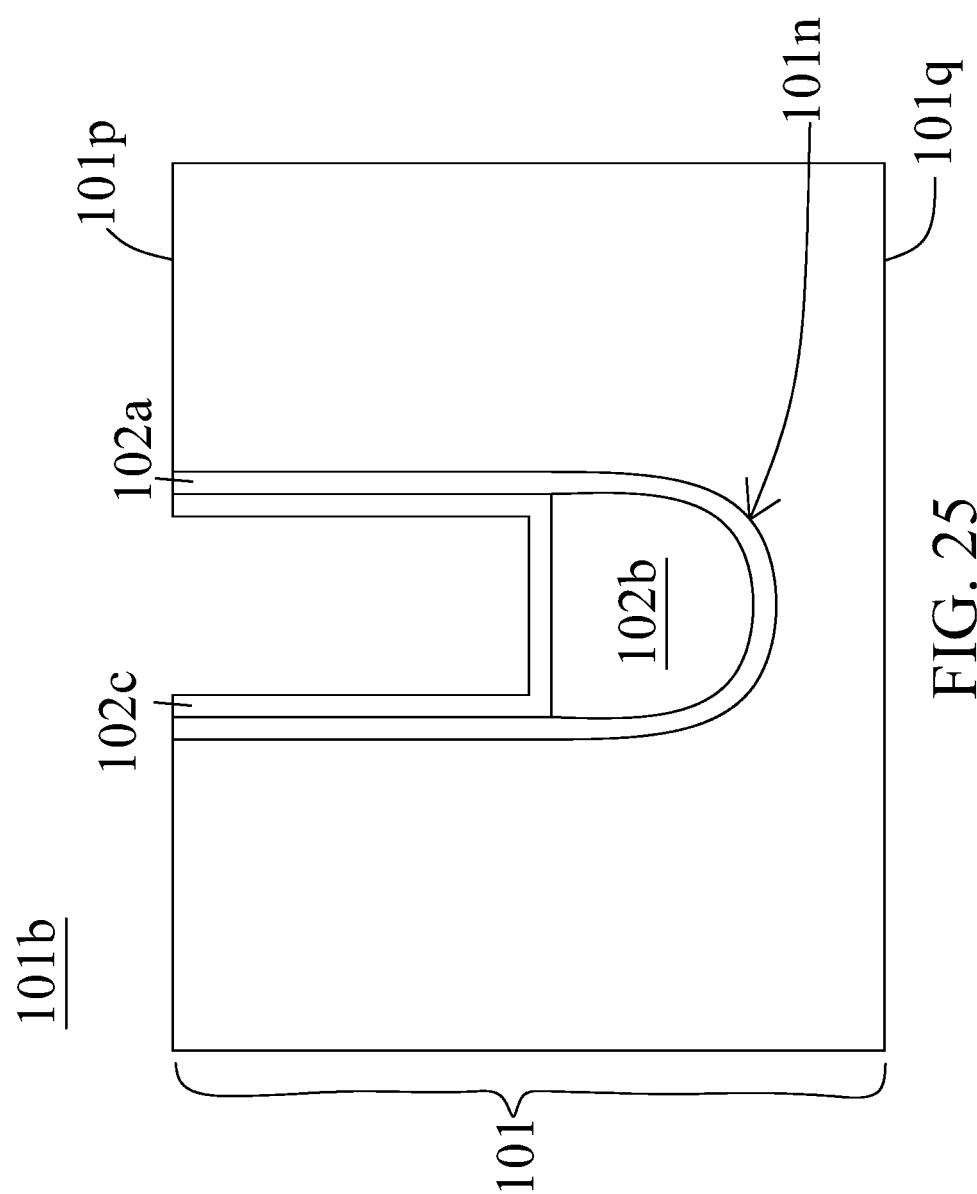

After the formation of the gate electrode 102b, a buffering dielectric 102c is formed as shown in FIG. 25. The buffering dielectric 102c is conformal to the gate oxide 102a and is disposed on the gate electrode 102b. In some embodiments, the buffering dielectric 102c is disposed by deposition, CVD or any other suitable process. In some embodiments, the buffering dielectric 102c and the gate oxide 102a include same or different materials. In some embodiments, the buffering dielectric 102c is formed of an insulating material, such as silicon oxide, silicon nitride, silicon oxynitride, the like, or a combination thereof. In some embodiments, the buffering dielectric 102c includes dielectric material with a low dielectric constant (low k).

Figure 26:
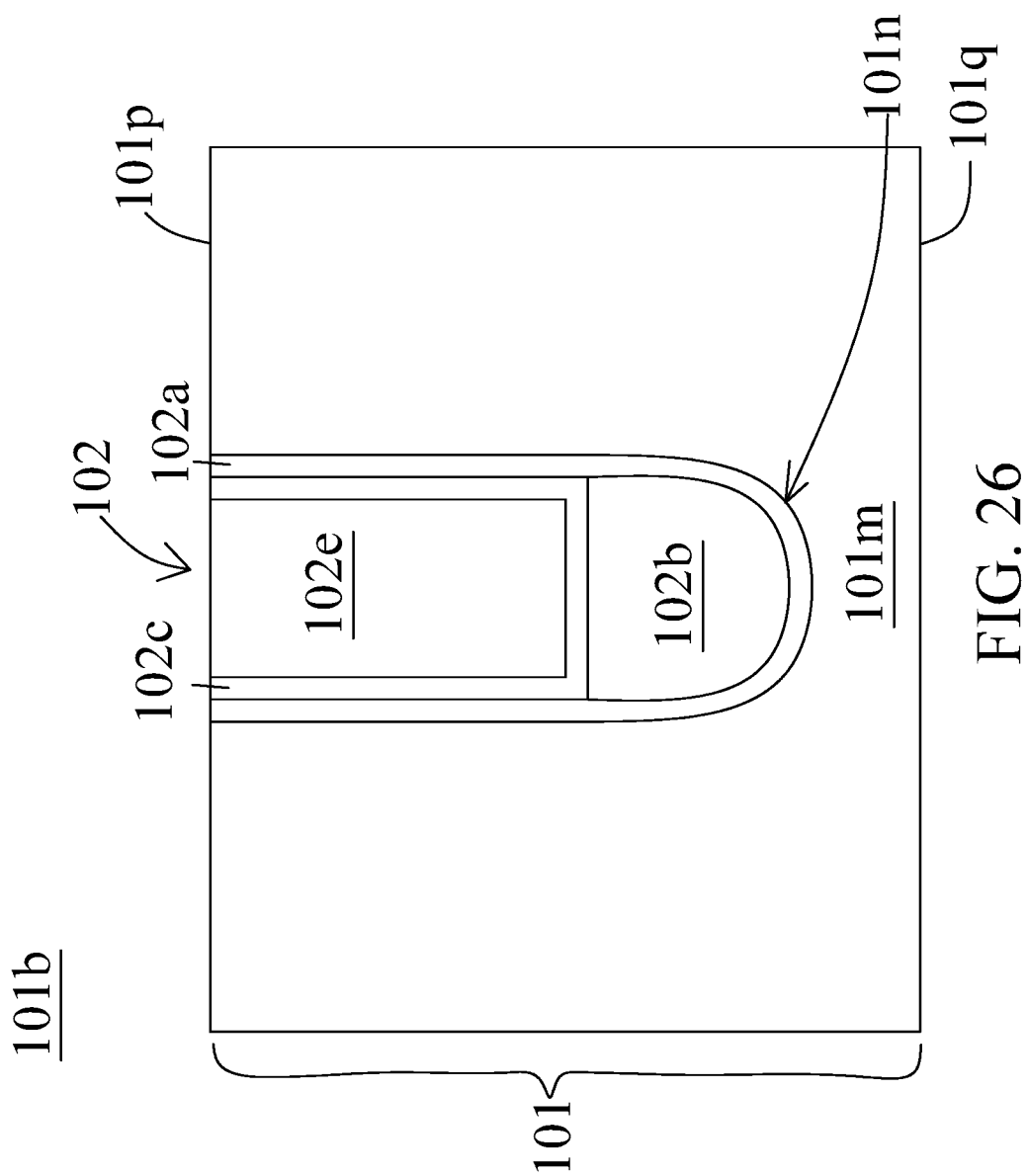

After the formation of the buffering dielectric 102c, a capping dielectric 102e is formed as shown in FIG. 26. In some embodiments, the capping dielectric 102e is surrounded by the gate oxide 102a and the buffering dielectric 102c. In some embodiments, the capping dielectric 102e is disposed by deposition, CVD or any other suitable process. In some embodiments, the capping dielectric 102e includes dielectric material such as nitride. In some embodiments, a top surface of the capping dielectric 102e is exposed through the first surface 101p of the semiconductor substrate 101. The word line 102 is formed as shown in FIG. 26.

Figure 27:
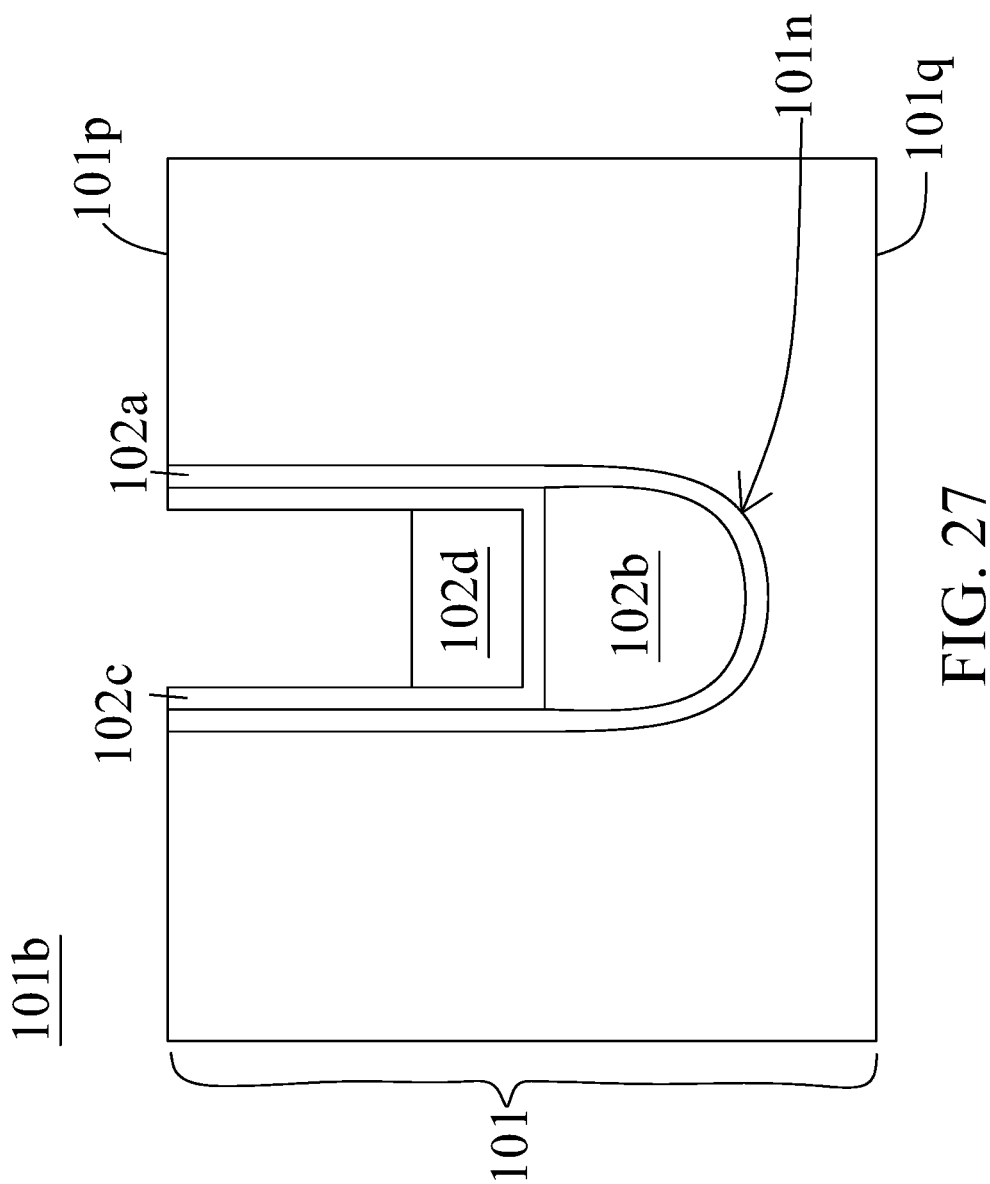

In some embodiments, the word line 102 further includes a work function member 102d. The work function member 102d is formed after the formation of the buffering dielectric 102 and before the formation of the capping dielectric 102e, as shown in FIGS. 27 to 28.

In some embodiments, the work function member 102d is formed within the trench 101n and surrounded by the buffering dielectric 102c. In some embodiments, the work function member 102d is disposed by deposition, CVD or any other suitable process. In some embodiments, the work function member 102d is between the gate electrode 102b and the capping dielectric 102e. In some embodiments, the work function member 102d includes polysilicon or polycrystalline silicon. The word line 102 including the work function member 102d is formed as shown in FIG. 28.

Figure 28:
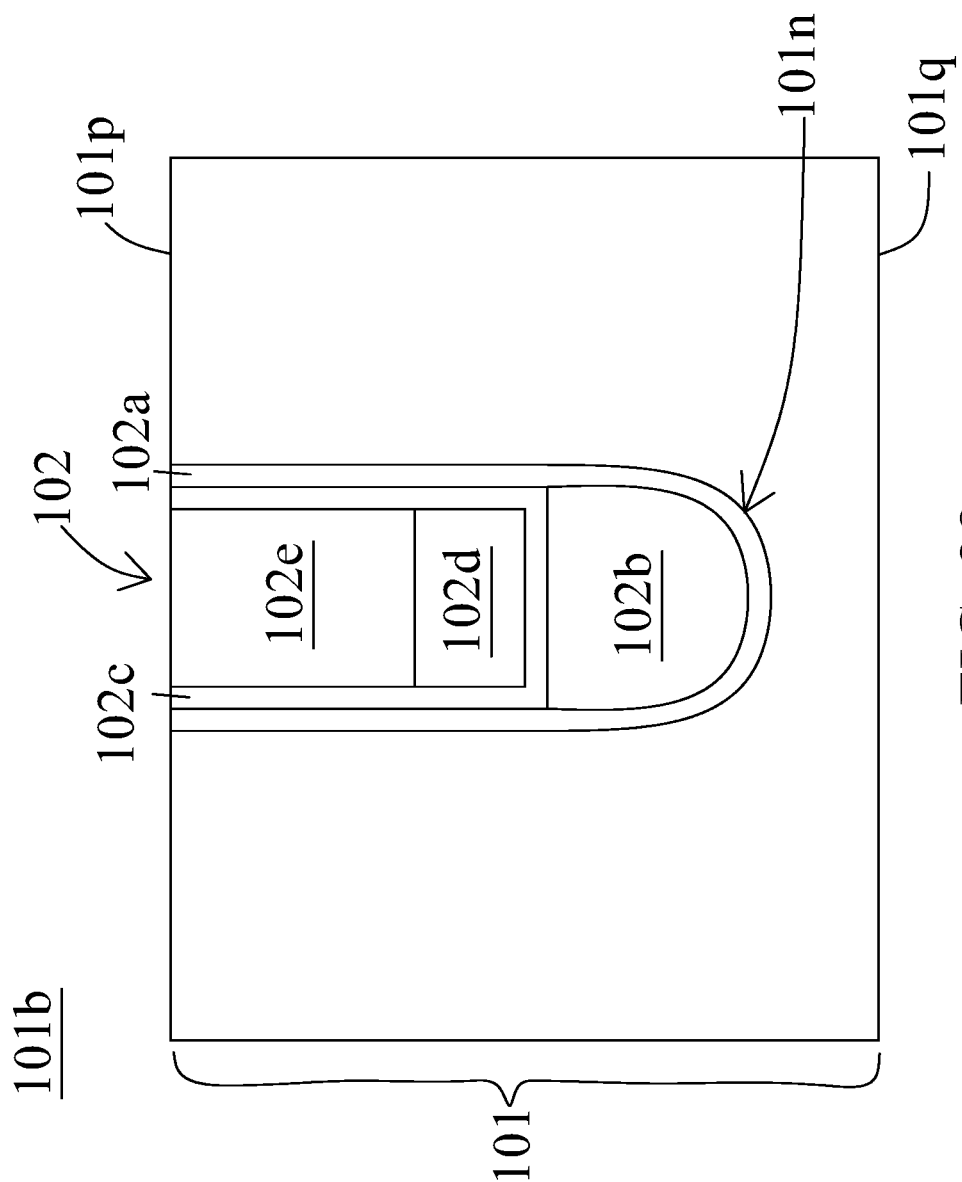
Figure 29:
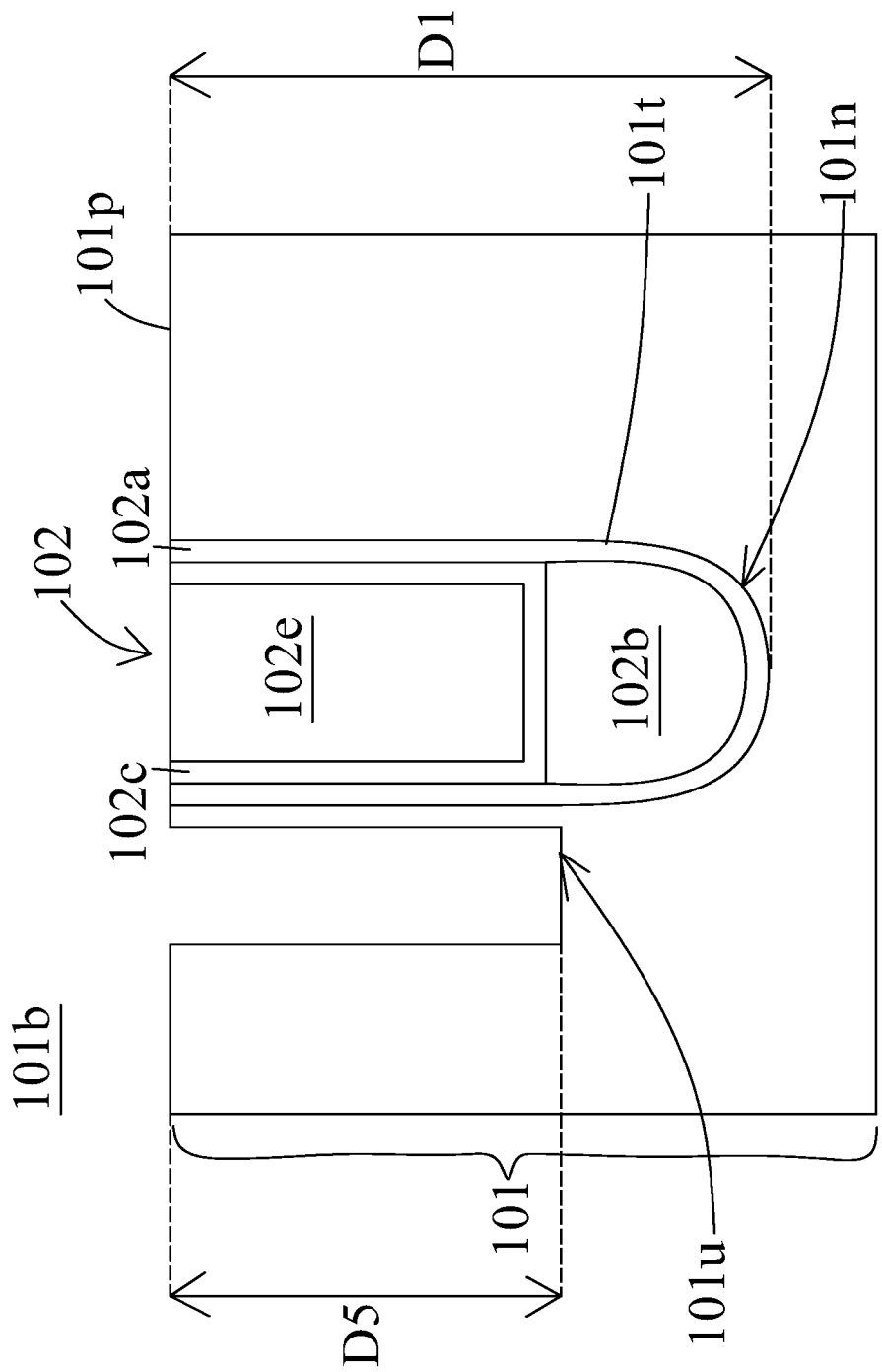
Figure 30:
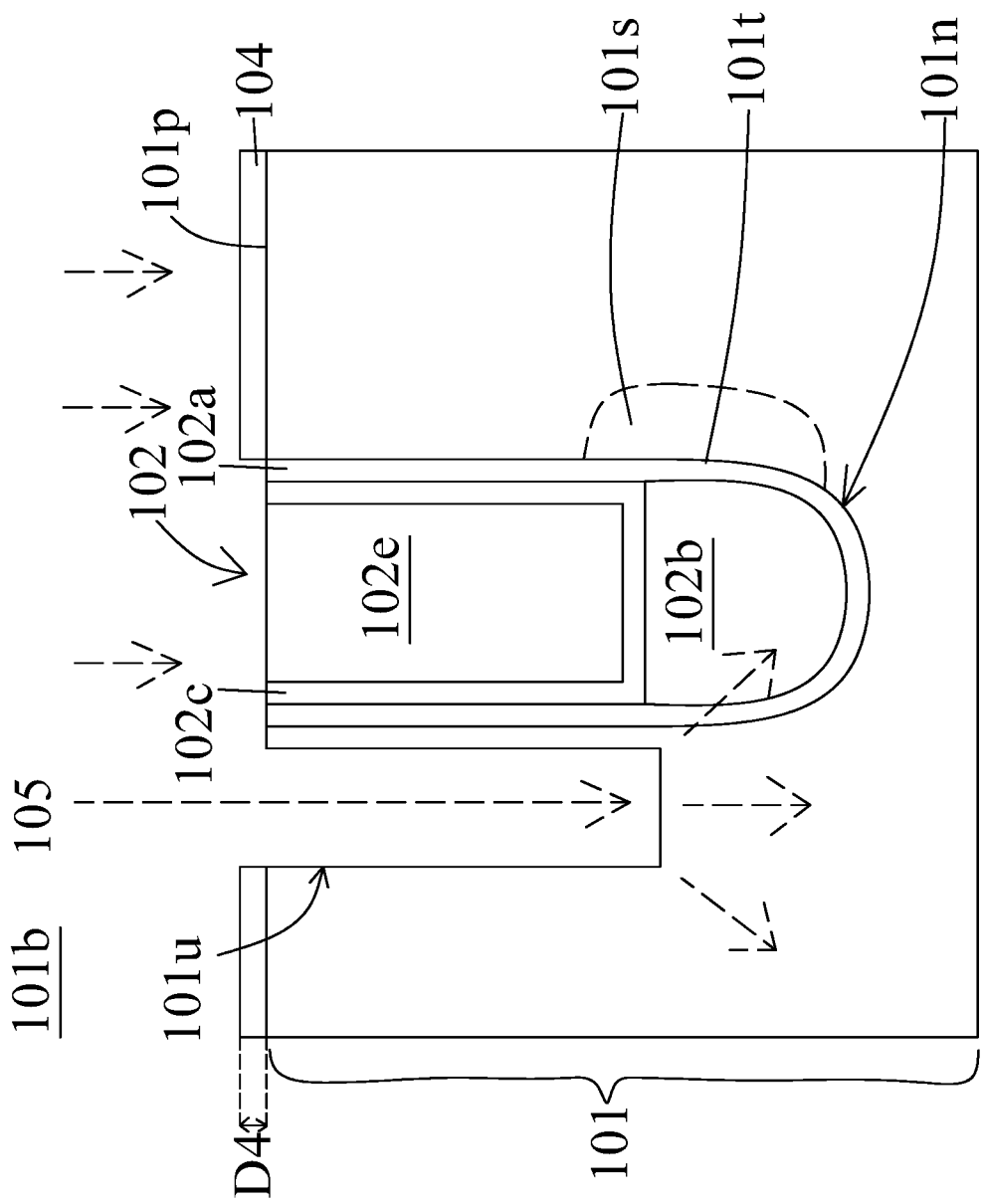

After the formation of the word line 102 as shown in FIG. 26 or FIG. 28, a doping process is subsequently implemented as shown in FIGS. 29 to 30.

Referring to FIG. 29, a recess 101u is formed according to step S403 in FIG. 20. In some embodiments, the recess 101u is formed by removing a portion of the semiconductor substrate 101. In some embodiments, the removal of the portion of the semiconductor substrate 101 can be implemented by etching or any other suitable process.

In some embodiments, the recess 101u is disposed adjacent to the word line 102 and extends partially through the semiconductor substrate 101. In some embodiments, a depth D5 of the recess 101u is about 10 nm to about 50 nm. In some embodiments, the depth D5 of the recess 101u is substantially less than a depth D1 of the word line 102.

Referring to FIG. 30, dopants 105 are implanted into the semiconductor substrate 101 according to step S404 in FIG. 20. In some embodiments, the implantation of the dopants 105 is performed after the formation of the word line 102. In some embodiments, a hard mask layer 104 is disposed over the first surface 101p of the semiconductor substrate 101 prior to the implantation.

In some embodiments, the dopants 105 are implanted into the semiconductor substrate 101 through the recess 101u. The dopants 105 collide with the semiconductor substrate 101 exposed through the recess 101u and diffuse across the word line 102 as shown in FIG. 30 to form an ultra-lightly doped region 101s over a sidewall 101t of the word line 102 as shown in FIG. 30.

In some embodiments, as shown in FIG. 30, the dopants 105 travel toward the hard mask layer 104 and the first surface 101p of the semiconductor substrate 101. In some embodiments, the dopants 105 travel toward the hard mask layer 104 and the first surface 101p at an angle of about 5° to 10°. In some embodiments, the dopants 105 are N-type dopants or P-type dopants. In some embodiments, the dopants 105 include boron or phosphorous.

The hard mask layer 104 can block the dopants 105 from being implanted into the semiconductor substrate 101. The dopants 105 are unable to pass through the hard mask layer 104. In some embodiments, the hard mask layer 104 has the thickness D4 preventing the dopants 105 from passing through the hard mask layer 104. In some embodiments, the dopants 105 possess kinetic energy insufficient to pass through the hard mask layer 104. In some embodiments, the dopants 105 possess kinetic energy in a range of about 1 KeV to about 30 KeV. In some embodiments, the dopants 105 possess kinetic energy in a range of about 1 KeV to about 5 KeV. In some embodiments, the dopants 105 possess kinetic energy in a range of about 5 KeV to about 30 KeV.

In some embodiments, the dopants 105 travel toward the recess 101u and enter into the semiconductor substrate 101, and then diffuse across the word line 102. In some embodiments, the dopants 105 are partially blocked by the word line 102. In some embodiments, the dopants 105 travel along or through the word line 102.

Figure 31:
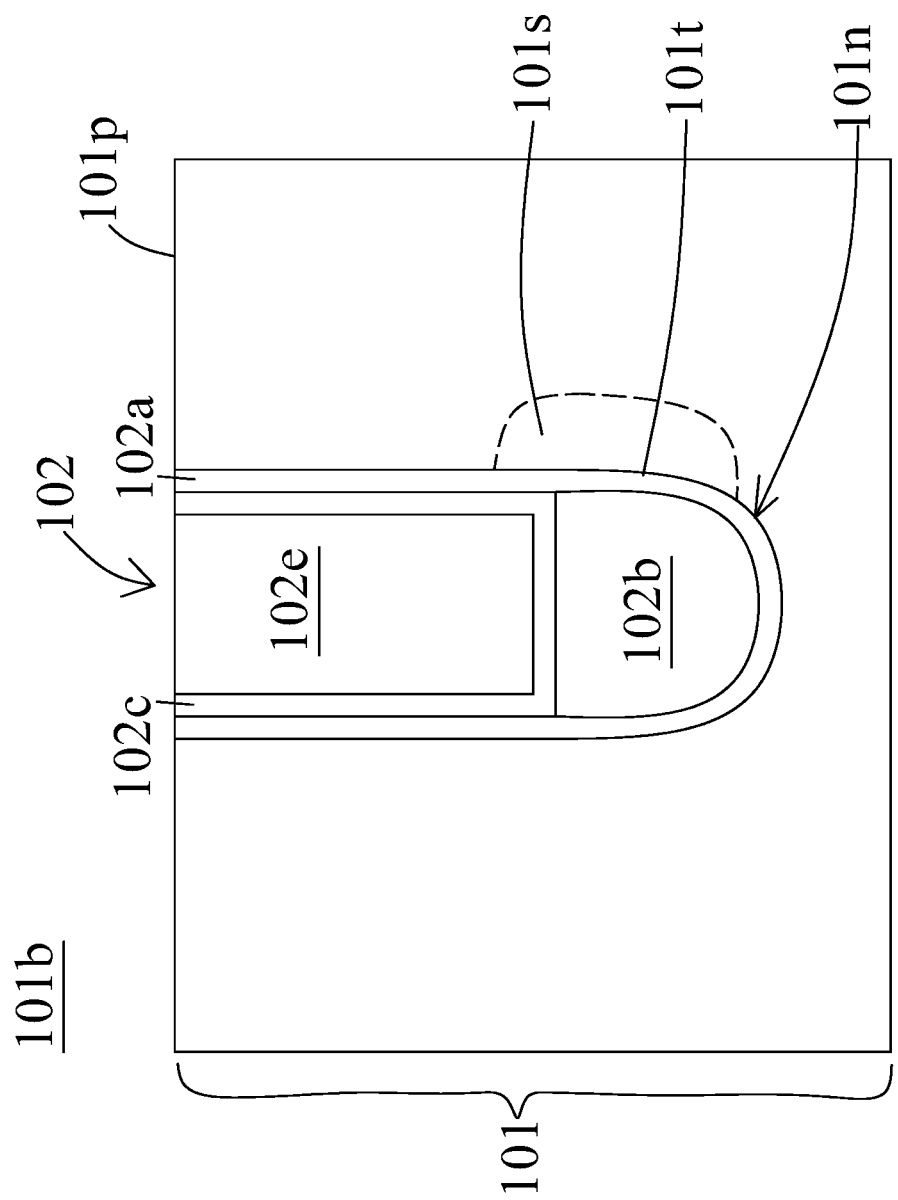

Since the dopants 105 diffuse across the word line 102 or are partially blocked by the word line 102, a doping concentration of the dopants 105 at the sidewall 101t is substantially greater than a doping concertation of the dopants 105 under the recess 101u. After the implantation of the dopants 105, the ultra-lightly doped region 101s is formed as shown in FIG. 30. In some embodiments, the doping concentration of the ultra-lightly doped region 101s is about $10^{16}$ per cm$^3$ to about $10^{18}$ per cm$^3$. In some embodiments, after the step S404, a semiconductive material such as silicon fills the recess 101u as shown in FIG. 31, so that the recess 101u becomes invisible.

Figure 32:
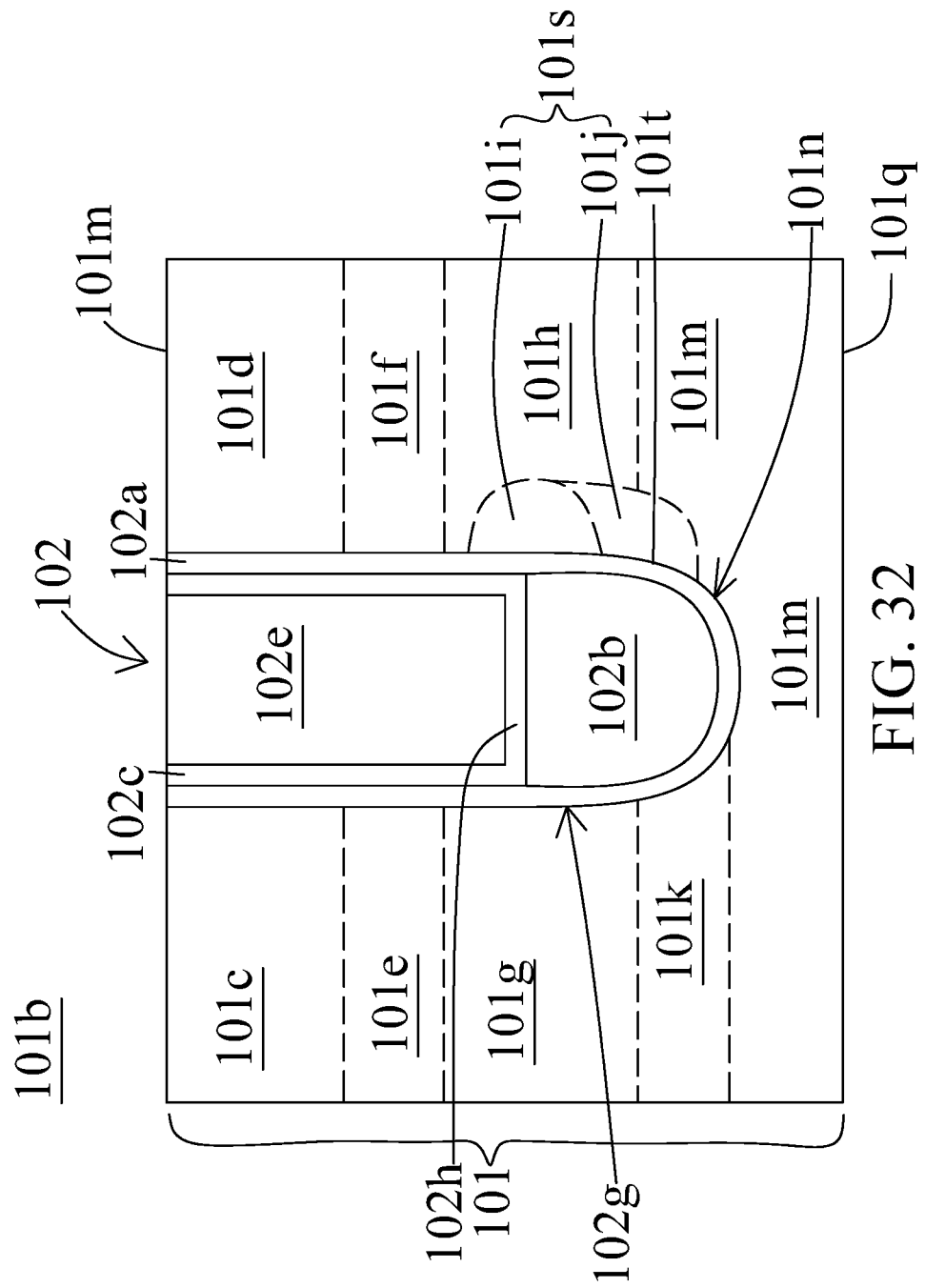

Other doped regions are formed as shown in FIG. 32. In some embodiments, the ultra-lightly doped region 101s at least partially surrounds a lower portion 102g of the word line 102. In some embodiments, the ultra-lightly doped region 101s is adjacent to a bottom portion 102h of the buffering dielectric 102c. In some embodiments, the ultra-lightly doped region 101s is formed by implanting the dopants 105 in N-type to form a first ultra-lightly doped region 101i, and implanting the dopants 105 in P-type to form a second ultra-lightly doped region 101j.

In some embodiments, a source region 101c, a drain region 101d, a first heavily doped region 101e, a second heavily doped region 101f, a first lightly doped region 101g, a second lightly doped region 101h, a third heavily doped region 101k and a third lightly doped region 101m are formed as shown in FIG. 32, by implanting dopants of suitable conductivity types.

In some embodiments, the ultra-lightly doped region 101s has a doping concentration less than those of the source region 101c, the first heavily doped region 101e, the second heavily doped region 101f, the first lightly doped region 101g, and the second lightly doped region 101h. The doping concentration of the second heavily doped region 101f is substantially less than that of the drain region 101d and is substantially greater than the doping concentration of the ultra-lightly doped region 101s. The doping concentration of the second lightly doped region 101h is substantially less than that of the second heavily doped region 101f and is substantially greater than the doping concentration of the ultra-lightly doped region 101s.

Figure 33:
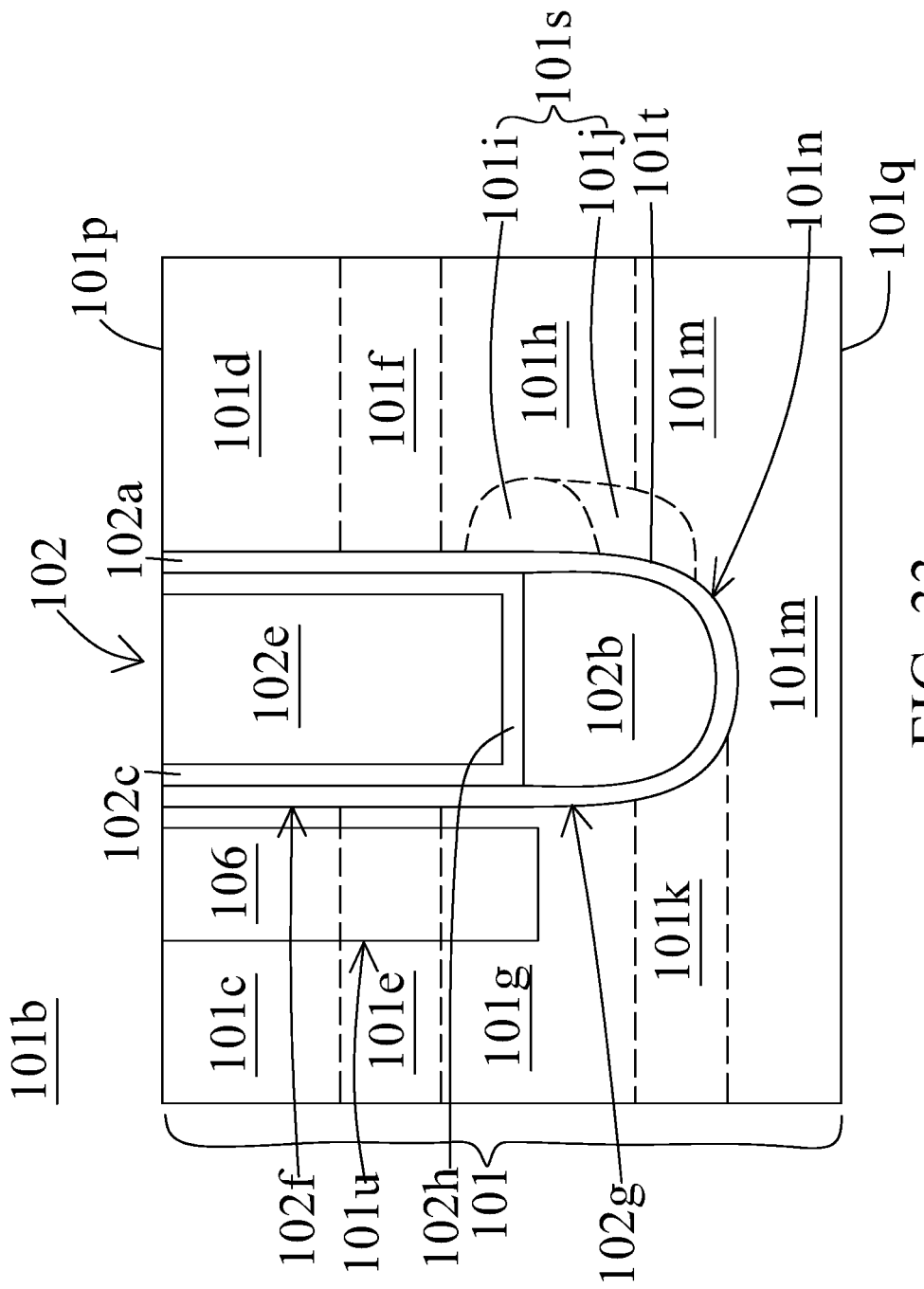

In some embodiments, a material fills the recess 101u to form the plug 106 as shown in FIG. 33. In some embodiments, the memory device 200 of FIG. 6 is formed. In some embodiments, the memory device 200 undergoes a thermal anneal at a low temperature. In some embodiments, the thermal anneal is a rapid thermal processing (RTP) at a temperature of less than 1000° C. and is performed for a duration of less than 12 hours. In some embodiments, the temperature is about 800° C.

In an aspect of the present disclosure, a memory device is provided. The memory device includes a semiconductor substrate including a word line extending into the semiconductor substrate, wherein the semiconductor substrate is defined with a source region, a drain region and an ultra-lightly doped region under the drain region, the word line is disposed between the source region and the drain region, and the ultra-lightly doped region is disposed at a sidewall of the word line.

In another aspect of the present disclosure, a memory device is provided. The memory device includes a semiconductor substrate including a word line extending into the semiconductor substrate and a plug extending into the semiconductor substrate and disposed adjacent to the word line, wherein the semiconductor substrate is defined with a source region, a drain region opposite to the source region, and an ultra-lightly doped region under the drain region, the word line is disposed between the source region and the drain region, and the ultra-lightly doped region is disposed at a sidewall of the word line.

In another aspect of the present disclosure, a method of manufacturing a memory device is provided. The method includes steps of providing a semiconductor substrate; forming a word line extending into the semiconductor substrate; forming a recess adjacent to the blocking member; and implanting dopants into the semiconductor substrate through the recess, wherein the dopants collide with the semiconductor substrate exposed through the recess and diffuse across the word line to form an ultra-lightly doped region over a sidewall of the word line.

In conclusion, because an ultra-lightly doped region can be formed adjacent to a word line and under a drain region connected to a capacitor, a gate-induced drain leakage (GIDL) can be suppressed. Further, the ultra-lightly doped region is formed by removing a portion of a substrate to form a recess adjacent to the word line, and then implanting dopants through the recess. The dopants are partially blocked by the word line. As a result, the ultra-lightly doped region can be formed at a sidewall of the word line. Therefore, a thermal budget for manufacturing a memory device having the ultra-lightly doped region can be reduced. As a result, reliability and performance of the memory device are improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A memory device, comprising:
a semiconductor substrate including a word line extending into the semiconductor substrate,
wherein the semiconductor substrate is defined with a source region, a drain region and an ultra-lightly doped region under the drain region, the word line is disposed between the source region and the drain region, and the ultra-lightly doped region is disposed at a sidewall of the word line;
wherein the semiconductor substrate is further defined with a heavily doped region under the drain region and a lightly doped region above the ultra-lightly doped region.

2. The memory device according to claim 1, wherein the source region and the drain region at least partially surround an upper portion of the word line, and the ultra-lightly doped region at least partially surrounds a lower portion of the word line.

3. The memory device according to claim 1, wherein a doping concentration of the drain region is substantially greater than a doping concentration of the ultra-lightly doped region, and a doping concentration of the source region is substantially greater than the doping concentration of the ultra-lightly doped region.

4. The memory device according to claim 1, wherein the heavily doped region and the lightly doped region are disposed between the drain region and the ultra-lightly doped region, and the heavily doped region is disposed between the drain region and the lightly doped region.

5. The memory device according to claim 1, wherein a doping concentration of the heavily doped region is substantially less than a doping concentration of the drain region and is substantially greater than a doping concentration of the ultra-lightly doped region.

6. The memory device according to claim 1, wherein a doping concentration of the lightly doped region is substantially less than a doping concentration of the heavily doped region and is substantially greater than a doping concentration of the ultra-lightly doped region.

7. The memory device according to claim 1, wherein the ultra-lightly doped region is below a surface of the semiconductor substrate by a distance of about 20 nm to about 80 nm.

* * * * *